United States Patent
Shinozaki et al.

(10) Patent No.: US 7,025,005 B2
(45) Date of Patent: Apr. 11, 2006

(54) STAGE DEVICE AND ANGLE DETECTING DEVICE

(75) Inventors: Hiroyuki Shinozaki, Kanagawa (JP); Hirosi Sobukawa, Kanagawa (JP); Shoji Yoshikawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 277 days.

(21) Appl. No.: 10/347,208

(22) Filed: Jan. 21, 2003

(65) Prior Publication Data

US 2003/0136309 A1    Jul. 24, 2003

(30) Foreign Application Priority Data

Jan. 22, 2002  (JP) .............................. 2002-012338
Feb. 27, 2002  (JP) .............................. 2002-051256

(51) Int. Cl.
*A47B 85/00* (2006.01)
(52) U.S. Cl. ........................................... 108/20; 74/16
(58) Field of Classification Search ................. 108/20, 108/21, 22, 161, 143; 74/16; 269/73, 71, 269/20; 248/424, 429, 178.1
See application file for complete search history.

(56) References Cited

U.S. PATENT DOCUMENTS

| 4,118,042 A | 10/1978 | Booth |
| 4,191,385 A | 3/1980 | Fox et al. |
| 4,425,508 A | 1/1984 | Lewis, Jr. et al. |
| 4,462,580 A | 7/1984 | Nielsen |
| 5,784,925 A | 7/1998 | Trost et al. |
| 6,252,725 B1 | 6/2001 | Tran et al. |
| 6,445,440 B1 * | 9/2002 | Bisschops et al. ............ 355/53 |
| 6,499,880 B1 * | 12/2002 | Tsuda et al. ................... 384/9 |
| 6,515,288 B1 * | 2/2003 | Ryding et al. ......... 250/441.11 |
| 6,618,122 B1 * | 9/2003 | Bisschops et al. ............ 355/72 |
| 6,735,867 B1 * | 5/2004 | Tsuda et al. ............. 29/898.02 |

FOREIGN PATENT DOCUMENTS

JP    2002-106563 A    4/2002

* cited by examiner

*Primary Examiner*—Jose V. Chen
(74) *Attorney, Agent, or Firm*—Westerman, Hattori, Daniels & Adrian, LLP

(57) ABSTRACT

The present disclosure provides a stage device applicable to a semiconductor manufacturing apparatus. A stage device 10 comprises a Y-axis stage 20 and an X-axis stage 40, the Y-axis stage 20 including a fixed component 21 and a movable component 26 movable along the Y-axis, the X-axis stage 40 including a fixed component 41 and a movable component 43 movable along the X-axis, wherein the fixed component 41 of the X-axis stage 40 is disposed on the movable component 26 of the Y-axis stage 20, the Y-axis is designed as a scanning axis, while the X-axis is designed as a stepping axis, and a non-contact sealing device is arranged between the fixed component 21 and the movable component 26 of the Y-axis stage 20.

20 Claims, 27 Drawing Sheets

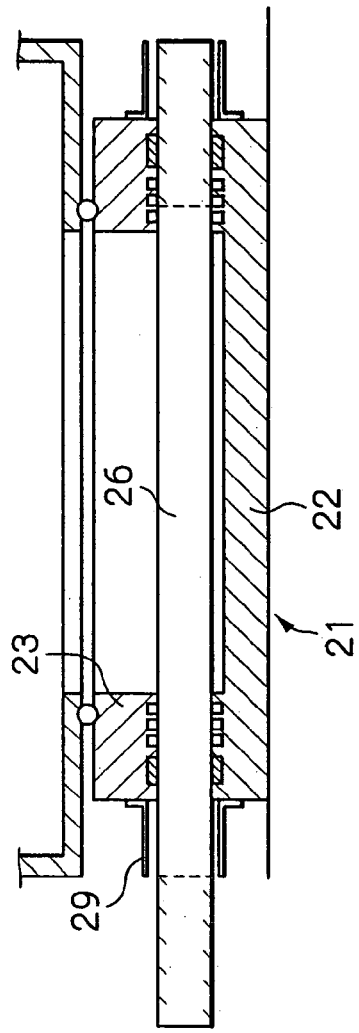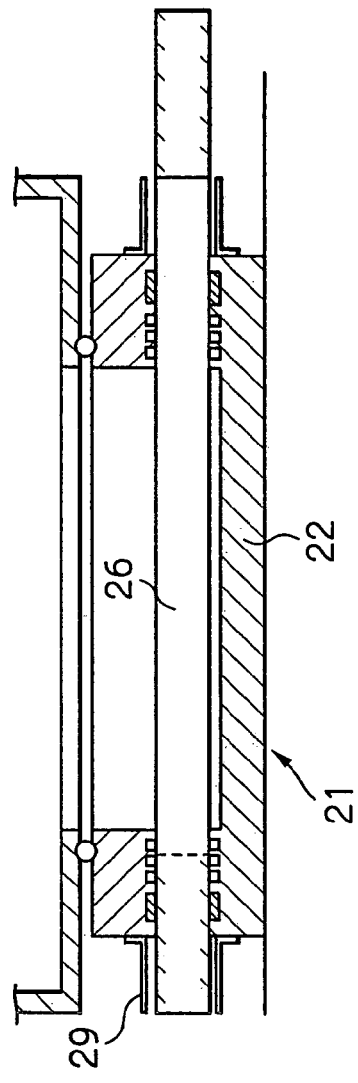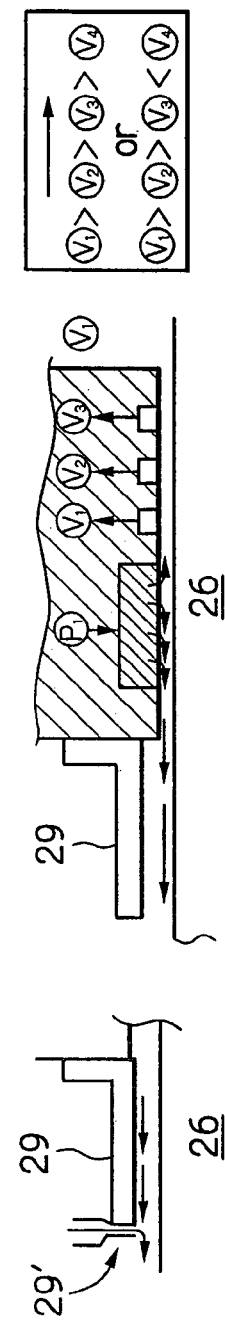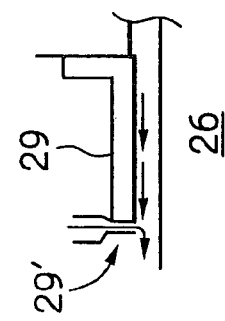
Fig. 18A
Fig. 18B
Fig. 18C
Fig. 18D

STAGE DEVICE AND ANGLE DETECTING DEVICE

BACKGROUND OF THE INVENTION

The present invention relates to a stage device for use in a manufacturing apparatus or an inspection apparatus for a semiconductor device, or a microscope and/or a variety of processing machines in which fine positioning operations are carried out and also to an angle detecting device adapted to be used in a stage device and enabling a broad range of measurement while providing a high resolving power to realize a resolution of one tenth of a few second and a dynamic range of a few degrees.

A stage device is commonly employed in an apparatus for manufacturing or inspecting a semiconductor device, as well as in an apparatuses for manufacturing other precision components. In the following description, the prior art of the stage device including an associated drive mechanism and guide mechanism which is used in a apparatus for manufacturing or inspecting semiconductor devices (hereafter referred to as a substrate processing apparatus) will be explained.

In recent years, circuit integration in semiconductors, such as a LSI, continues to increase and is approaching an extremely fine line width of a pattern in a range of 0.2 μm or less. In order to manufacture or inspect such a highly integrated semiconductor, it is necessary to employ a stage device that can be highly precisely adjusted.

Such a stage device functions to retain and freely move a substrate (a wafer or a reticle) used in fabricating a semiconductor.

(1) Substrate Retaining Function:

A variety of chucking systems including a vacuum chuck, an electrostatic chuck, a mechanical chuck and the like are commonly employed for retaining a substrate; of which, an electrostatic chuck is now most commonly employed. In association with the chucking system, a variety of mechanisms are arranged for performing the following functions (2) to (5).

(2) Z-axis Directional Movement Function:

This is a function for retaining the substrate in a horizontal position on the chuck, while adjusting its height in a direction of a vertical axis (an up and down direction). This movement function is used during a focusing operation in carrying out exposure and inspection processes.

(3) Θ-axis Directional Movement Function:

This is a function for adjusting a position of the substrate held by the chuck in a direction of rotation around the vertical axis. This function is used for correcting a small angular deviation between a scanning line of a scanning axis and an array of patterns on the wafer, which will be described later.

(4) X-axis Directional Moving Function:

This is a function for moving the substrate held by the chuck in a horizontal direction. The X-axis is also referred to as a scanning axis (an axis along which a scanning movement of a movable component is performed) to expose or inspect the substrate from one end to the other end across the array of patterns thereon.

(5) Y-axis Directional Moving Function:

This is a function for moving the substrate held by the chuck in the Y-axis direction crossing at a right angle with said X-axis within a horizontal plane. In general, the Y-axis may also be referred to as a stepping axis (an axis along which a stepping movement of a movable component is performed) for stepping across the array of patterns on the substrate.

In addition to the functions described above, a further function (6) exist for use in loading or unloading the substrate onto or off the stage device. This function (6) is referred to as a "raise" function, and is employed to raise the substrate in a vertical direction upon loading or unloading the substrate onto or off the stage device, and therefore, differs from the Z-axis directional movement function designated above in (2).

The mechanisms employed to carry out the above-described functions are rigidly supported on a platen (or a platen-shaped base plate).

The substrate processing apparatus further includes a vibration isolator disposed below the base plate, which functions to prevent the transmission of vibration from a floor area to the stage device. A vibration isolator which is now in common use is designed to function so as to actively attenuate (offset) vibration during movement of a movable component of the stage device.

As will be apparent from the forgoing description, a stage device used in substrate processing apparatus is an aggregation of mechatronics and is equipped to perform a variety of functions. These functions are required to be carried out quietly and highly precisely.

Turning now to the X-axis and the Y-axis directional movement functions of the stage device, generally there are three different methods which are employed for controlling the stage device, as follow:

(a) A method which enable motion of the stage device, which comprises tables movable in any of the X-axis, the Y-axis and the Θ-axis directions to be stopped while the substrate is processed, This method is typically employed in an exposing apparatus such as a stepper for performing a step and repeat operation. By using this method, it is possible to process the substrate after vibration associated with movement of a table of the stage device has been attenuated.

(b) A method in which the X-axis (stepping axis) movable table is stopped, while the Y-axis (scanning axis) movable table is allowed to continue to move while the substrate is being processed. This method may be employed in an electron beam drawing apparatus and/or an inspection apparatus, which will be described later.

(c) A method in which both the X-axis and the Y-axis tables are allowed to move freely in carrying out substrate processing.

In the case of (a), above, any unwanted change in speed, or transmission of vibration to the stage unit, it not likely to give rise to a serious processing error. However, in the case of (b) and (c), where the substrate is moved continuously at a constant speed in an exposure or inspection operation. Any such change in speed or transmission of vibration, is likely to give rise to a serious processing error.

An essential component for controlling in a highly precise manner movement of a movable component such as a respective table of the stage device described above is a position detector. Commonly employed in a position detection method is an interference optical system. Recently, such a system has been required to be able to detect displacement of a substrate in a range of nanometers. However a problem exists with such a system in that fluctuations in interference light caused by atomspheric gas density variation in the system, which are caused by temperature fluctuations in the system, result in a deterioration in detection accuracy in the field and the field itself.

A further problem of the conventional substrate processing apparatus is that where it is required to produce a fine and highly precise pattern, as is the case in very Large Scale Integration, when a method is employed whereby light is irradiated to a photo resist film to obtain a desired patterning, an inherent restriction exists in an available wavelength of a light source employed. One method that has been proposed to solve this problem involves the use of an electron beam, instead of a light source. As technique being used in such a method there can be mentioned electron beam exposure (a charged particle beam exposure), and electron beam drawing (charged particle beam drawing). Such techniques are now being intensively developed, and involve irradiation of an electron beam into a clean space constituted of an almost complete vacuum. The same condition described above may be required for the inspection apparatus using the electron beam (or the charged particle beam).

In a substrate processing apparatus in which an electron beam is employed to detect displacement of a substrate, it is necessary to provide a stage device that is able to move the substrate in a highly precise and even manner within a vacuum. As such a unit, there currently exists one that comprises a contact type translatory guide, such as a linear motion guide (LM guide), a cross roller guide, and a sliding guide, and which are provided in combination with a drive mechanism combining a ball screw and nut with a servo motor or a supersonic motor; or in combination with a driving mechanism referred to as a friction drive mechanism, which includes a pushing shaft sandwiched between two rollers, the pushing shaft being evenly moved under driving of the rollers by means of a servo motor or a supersonic motor. Since each of the these motors is a contact-type motor, they require a lubrication oil.

Recently, an XY stage device has been employed in which a fine ceramic is utilized to form a structural member and an associated cross roller guide. This guide is used in combination with a drive mechanism comprising a direct supersonic motor to provide a translatory guide, thereby enabling a highly precise and high resolution feed operation to be effected. In a modification of such an XY stage, one in which a hydrostatic bearing is employed as a translatory guide has been suggested. Such a guide is now generally provided as a single unit, and is highly precise. However, it suffers from a drawback in that it requires an additional gas feed and/or gas exhaust piping.

It is to be noted here that in a stage device that is required to highly precisely move a substrate, if a ball screw drive mechanism is employed, it is almost impossible to eliminate deflection in a screw shaft, and therefore with each rotation of the screw shaft an undesired movement? of the ball screw is likely to occur, thereby adversely effecting positioning accuracy. Further disadvantageously, rotation of the screw shaft at high speed is likely to result in vibration and noise resulting not only (from undesirable movement) from whirling, but also from ball collision, or from collision of balls with a return tube as they circulate.

While a stage device that is directly driven by a supersonic motor may be used in a stepper for performing a step and repeat operation (that is, during an exposing operation wherein respective movable tables of the stage device are stopped), this type of stage device cannot be used in a substrate processing apparatus in which an exposure or inspection operation should be carried out with movement of respective movable tables. The reason is that excessive fluctuations in a speed of movement occur, along with vibration. Further, in an XY stage employing a hydrostatic bearing as a translatory guide, a gas feed piping and/or a gas exhaust piping prevent the stage from moving evenly.

While the demand exists for a clean substrate processing space isolated from both a space inside the substrate processing apparatus and an associated clean room environment, and containing as few gas components as possible, the contact type drive mechanism and the translatory guide mechanism according to the prior art cannot require a lubricant to operate. However, a danger exists that a lubricant may vaporize and adhere to a surface of an electronic optical system. Upon irradiation with an electron beam, the adhered vapor turns into a black-tar-like substance which is a poor conductor, thereby leading to build up of an electrostatic charge in the system.

Further, there has been developed a means that a drive mechanism and translatory guide mechanism should be arranged externally to the processing space for the substrate, which provides an advantage that none of the devices used in these mechanisms is required to be specifically tailored for use in a vacuum. However, a drawback of such a means is that a space isolating or sealing mechanism is required. To this end, a magnetic fluid seal has been commonly employed in a place where a rotary shaft is introduced into a space in which a substrate is processed. However, a problem exists with this art in that a magnetic fluid utilized for the seal may vaporize and contaminate the atmosphere in which the substrate is processed. Moreover, such a seal is not sufficiently durable to effect sealing of the translatory shaft. A bellow seal commonly used to seal the translatory shaft is also problematic in that it interfere even movement of the shaft and an operating life thereof is short.

A non-contact seal is suggested in U.S. Pat. No. 4,191,385 (1980; Vacuum-Sealed Gas-Bearing Assembly). In this seal system, a moving plane is arranged to face a stationary plane with a narrow gap interposed therebetween, and plural rows of evacuation ports are formed in that plane, whereby a pressure difference can be step-wise controlled. However, such a system has not been put to practical use, although it would provide an even stage movement due to its non-contact design, since it is difficult to achieve a reliable sealing performance. The reason for this is that in this seal system, as a result of its structure a static pressure acting between each of the planes tends to vary leading to yawing and/or pitching in the stage, and thus a variation in a gap between two planes associated with movement of the stage tends to occur. A second reason resides in the fact that a displacement of a vacuum chamber, which defines the stationary plane, is measurably large in managing the sealing gap dimension.

On the other hand an encoder is commonly used as an angle-detecting device for to detecting an angle of rotation of an object such as, for example, a rotary table of Θ axis stage. The encoder comprises an optical light-emitting element and an optical photo light-accepting element each disposed in a fixed side, and a disc having a slit structure for intercepting or allowing transmission of light between them, disposed in a movable side.

For example, in an optical apparatus or the like, a rotary motor is typically employed as a device for positioning a reflective mirror with a highly precise angle, and in this case an encoder feed back control is generally employed as an angle control method, in which a rotary encoder directly coupled with the motor is used as an angle detector. In addition, a speed reduction mechanism is sometimes employed as a means for improving resolution.

However, if the encoder is used to detect the angle, an angle resolution may be restricted by an output pulse rate (pulses/rotation angle) of the encoder. Owing to this, several ideas have been taken into consideration in order to achieve a high resolution, and they include: (1) narrowing the width of each slit formed in the encoder disc mounted on a movable element side so as to increase the number of the slits; and (2) using a speed reduction mechanism for an extensive detection; and so on.

In order to realize the above-stated idea (1), such a method has been practically embodied in which a light intercepting material such as nickel is vapor deposited on a glass disc for improving the resolution. This method is based on the fact that in the prior art approach in which the slits are formed in a plate (e.g., a stainless plate) by etching, a thickness of the plate may be a factor in inhibiting the light transmission. Namely, an effective slit width in the course from a light-emitting section to a photo light-accepting section may be reduced in dependence on an inclination of the disc, wherein the narrower slit interval could bring about more serious affection and the slit could be finally blocked. From this viewpoint, the light intercepting member having a thin film may be more favorable and, therefore, a film made by a vapor deposition method as mentioned above has been employed. A method for realizing the above-stated idea (2) may cause a problem of rattling and/or back-lash from the speed reduction mechanism, which may adversely affect the precision of the device.

In this circumstance, a key to good performance is how fine and how thin a slit structure of the light-intercepting material can be formed in the encoder disc. However, as the slit width is made narrower, forming slits equally spaced circumferentially may be more difficult, which inevitably result in a condition where a diameter of the encoder disc needs to be enlarged in order to increase the resolution (because it is difficult to achieve such a detecting device having both a broad dynamic range and a fine resolution).

On the other hand, those devices having achieved good actual results in a field of measuring a linear distance and/or a linear movement include, what are referred to as, a linear encoder, a linear sensor or a laser scale. A target installed on the movable element side of such linear movement measuring means may comprise a plate (glass) having a good light transmissivity and equally spaced light intercepting materials mounted on said glass plate. Basically, this type of detecting devices has the same principle as the rotary encoder and the slit width of 0.1 µm is currently available in some detectors.

Under the conditions described above, an idea has emerged that the above-mentioned linear encoder should be applied to an angle detection of a rotating object. Starting from this idea, an influence upon a detection performance of a relative angle between a detecting device made up of a linear encoder and a target was researched, and the result presented. FIG. 30 shows a physical relationship between the detecting device and the target as well as a definition of the coordinate axes therefor. It is noted herein that a movement detecting direction is typically designated by a translatory motion axis along the X-axis direction.

First of all, the translatory motion of the target in the Z-axis direction is not detected in principle. Further, in principle, the translatory motion in the Y-axis direction is not detected. in so far as it is within a range of slit length. However, it has been found that such an event as an inclinatory motion around the Z-axis (A-axis; pitching) or an inclinatory motion around the Y-axis (B-axis; yawing) may have an influence on the detecting performance in its sensing ability and error. The reason for this arises from a factor similar to that as set forth above: "in the prior art approach in which slits are formed in a plate (e.g, a stainless plate) by etching, a thickness of the plate may be a factor in inhibiting the light transmission. That is, an effective slit width in the course from a light-emitting section to a photo light-accepting section may be reduced in dependence on an inclination of the disc, wherein the narrower slit interval could bring more serious affection and the slit could be finally blocked." For this reason, a linear encoder could not be applied to the angle detection directly without being modified.

SUMMARY OF THE INVENTION

An object of the present invention is to provide a stage device in which even movement of a movable component is attained by eliminating a sliding contact between a fixed component and the movable component.

Another object of the present invention is to provide a stage device, in which the movable component can be driven in a uniform and even manner without any error.

Another object of the present invention is to provide a stage device in which highly accurate position measurement of the movable component can be attained eliminating an influence of distortion of a housing defining a vacuum chamber functioning as a processing space.

A still further object of the present invention is to provide a stage device by which processing of a substrate can be carried out while the movable component is being moved, by ensuring that the movable component always moves evenly at a precisely controlled speed.

A still further object of the present invention is to provide an angle detecting device in which an angle detection of a rotating object can be attained in an appropriate manner by using a means for measuring a linear distance, such as a linear encoder, and which has a high resolution as well as a broad dynamic range.

In the future, in order to provide an apparatus for manufacturing a semiconductor in which micro-fabrication is progressively applied, it is essential that such a stage device that is able to be used such that a stepping axis, or an X-axis movable component or X-axis table, is stopped, while a scanning axis, or a Y-axis movable component or Y-axis table is enabled to move evenly. For achieving this problem, a practically feasible stage device is provided in this application.

The present invention provides a stage device for a semiconductor manufacturing apparatus, comprising a Y-axis stage including a fixed component and a movable component movable along the Y-axis, an X-axis stage including a fixed component and a movable component movable along the X-axis, the stage device characterized in that:

the fixed component of the X-axis stage is disposed in the movable component side of the Y-axis stage;

the Y-axis is designed as a scanning axis, while the X-axis is designed as a stepping axis; and a non-contact sealing device is arranged between the fixed component and the movable component of the Y-axis stage.

The stage device may have a configuration such that a hydrostatic bearing is arranged in the fixed component of the Y-axis stage for movably guiding the movable component of the Y-axis stage, and the non-contact sealing device is arranged on the same plane as of a bearing surface of the hydrostatic bearing, wherein a geometry of a cross section of a guiding portion of the movable component equipped with the non-contact sealing device is defined to be rectangular in shape, and the fixed component of the Y-axis stage is installed on a rigid base.

Further, in the above stage device, a housing defining a vacuum chamber for accommodating at least the X-axis stage may have a flat rectangular plane and the housing may be supported at its four corners by the base. In this case, the stage device may further comprise a laser interference type displacement meter for detecting a position of the movable component of the X-axis stage, wherein a fixed reference plane for an interferometer of the laser interference type displacement meter may be defined by the corner portions of the housing, or alternatively, the stage device may further comprise a laser interference type displacement meter for detecting a position of the movable component of the X-axis stage, wherein a fixed reference plane for an interferometer of the laser interference type displacement meter may be defined by a top surface of the base external to the chamber, and a pedestal for fixing the interferometer may penetrate a bottom wall of the housing with a sealing device arranged between this penetrated bottom wall and the pedestal.

Further, the stage device may further comprise a moisture barrier plate for preventing moisture from adhering on a surface of the movable component of the Y-axis stage, or alternatively, the stage device may further comprise a dry gas feeding shower nozzle for preventing moisture from adhering to the surface of the movable component of the Y-axis stage.

Still further, the stage device may comprise an irradiation unit for irradiating at least an electron beam or a charged particle beam, the irradiation unit disposed in a location opposite to the base with respect to the stage device.

More specifically, in the present invention, a practically feasible stage device can be provided by employing the features detailed below (1) to (4).

(1) The scanning axis or the Y-axis table is disposed outside a processing space for a substrate or a vacuum chamber.
(2) The stepping axis or the X-axis table, as well as a Θ-axis table and a Z-axis table, which are each placed on the X-axis table, are disposed within the processing space for the substrate.
(3) To satisfy this condition, a non-contact (vacuum) sealing device is arranged in the scanning axis stage. The fixed component or a stator section of the scanning axis stage is disposed on a rigid platen-like base plate, and employs a non-contact type hydrostatic bearing for a translatory guide. In addition, the non-contact (vacuum) sealing device is arranged in the hydrostatic bearing surface at its substrate processing space side, or the movable component side or the movable stage side of the scanning axis stage.

Preferably, this hydrostatic bearing surface and the vacuum seal surface may be coplanar. This non-contact gap should be no greater than 10 μm, and preferably in the range of 5 μm. In order to attain a stage device can be highly precisely controlled while maintaining this small gap, it is preferable for the Y-axis stage to be disposed on the platen-like base plate.

(4) In contrast to the prior art XY stage device, in which the fixed component or stator of the Y-axis stage (the stepping axis stage) is located on the fixed surface and the X-axis stage (the scanning axis stage) is located on the movable component or movable table of the Y-axis stage, in the present invention, the Y-axis stage is designed for use as the scanning axis stage, and the X-axis stage placed on the movable table of this scanning-axis stage is designed for use as the stepping axis stage.

The reason for placing the stepping axis table is placed on the movable table of the scanning axis stage (hereafter referred to as the scanning axis table) will be described below. To make simplify the relevant description, processing of a rectangular reticle of square type rather than a wafer will be considered.

First of all, when one section of the reticle is to be processed, the movable table of the stepping axis stage (hereafter referred to as the stepping axis table) is required to have a running distance within a range of one to two times as long as an effective width of the reticle. In contrast, the scanning axis table should have a running distance within a range specified by, assuming that a linear pattern is to be drawn with a line width of 0.1 μm and a interval of 0.1 μm, for example, (although this is an extreme case), the value of (the effective width of the reticle/(0.1 μm×2)) multiplied by the effective width of the reticle. In one example, if the effective width of the reticle is equal to 130 mm, then the running distance of the stepping axis table is equal to 130–260 mm, and the running distance of the scanning axis table is equal to 84,500,000 mm=84.5 km. There would therefore be a difference of 325,000 times therebetween. Based on this estimation, 99.999% of the total running distance is occupied by a moving distance of the scanning axis table.

In another example, assuming that a linear pattern with a line width of 0.1 μm is to be scanned, for example, a square area having two sides of 5.0 μm on the reticle surface, the scanning axis table is required to move reciprocally with a pitch of 5.0 μm. A running distance of the scanning axis table is the value of (the effective width of the reticle/5.0 μm) multiplied by the effective width of the reticle. If the effective width of the reticle is equal to 130 mm, then the running distance of the stepping axis table is equal to 130–260 mm, and the running distance of the scanning axis table is equal to 3,380 m=3.4 km. There would therefore be a difference of between 13,000 to 26,000 times therebetween. Based on this estimation, 99.992% of the total running distance is occupied by a moving distance of the scanning axis table. In any cases, such differences in running distance between the stepping axis table and the scanning axis table is impractical. Consequently, it is practical from this viewpoint to mount the stepping axis stage on the scanning axis table. Accordingly, to maintain sufficient cleanliness within processing space it is necessary to arrange the drive mechanism and the translatory guide mechanism for the scanning axis stage externally to the processing space.

In other words, by using such a configuration, a maintenance cycle for an electron beam exposure machine with the stage device installed therein can be significantly extended.

Next, the reason for arranging the non-contact vacuum seal in the scanning-axis stage (between the stator section and the movable table of the scanning-axis stage) will be described. First of all, even movement (at a constant speed) is one of the most important performances of the scanning axis table during the substrate processing. As has already been described, to this end it is preferable to employ a translatory guide mechanism which is implemented by a non-contact mechanism; and the mechanism of choice in this regard is a hydrostatic bearing.

However, arranging a hydrostatic bearing in the substrate processing space is associated with the two problems described above. One problem resides in the necessity to provide gas via feed piping to a movable component or to the table side, thereby impeding an ability to evenly move the movable component. A second problem resides in a method employed to exhaust the gas fed to the table side or movable component. In the past, it has been proposed to directly emit such a gas into the substrate processing space and then exhaust it by using a large vacuum pump. However, such a method is not practical since it results in considerable deterioration in both a level of cleanliness and a level of a vacuum that are able to be maintained within the wafer processing space. As a remedy, there has been proposed the use of a bellow piping as an exhaust piping. Inevitably, however, use of such a piping impedes even movement of a stage.

As will be apparent from the foregoing, the only solution to enabling use of a non-contact hydrostatic bearing is to dispose the hydrostatic bearing externally to the substrate processing space. In addition, from the viewpoint of the problems as stated above, in such a scanning axis (X-axis) stage mounted on the stepping axis (Y-axis) stage, little merit can be perceived to exist in employing a translatory guide mechanism implemented by a hydrostatic bearing.

If the hydrostatic bearing is disposed externally to the substrate processing space so as to take full advantage of the hydrostatic bearing, a further requirement exists that the motion of the hydrostatic bearing must be transmitted to the wafer processing space. A contact sealing mechanism, if employed in a coupling structure, could make it difficult to accomplish a required even movement, and it is therefore necessary to employ a non-contact seal.

It is to be noted that a stepping axis (X-axis) stage mounted on the scanning axis (Y-axis) stage has the following features: (1) the running distance of the stepping axis stage is short; (2) the stepping axis stage must be held stationary during processing of the wafer; and (3) the stepping axis stage preferably has a structure that does not prevent movement of the scanning axis stage on which it is mounted.

Since it is desirable to eliminate piping and the like, a contact type translatory guide mechanism is employed and also a specific type of drive mechanism is employed which enables fine positioning control to be carried out. For example, preferably a cross roller guide may be used for the translatory guide, and a direct linear supersonic motor may be used for the drive mechanism. A variety of appropriate technologies in this respect are available in the art.

In a case that a contact type translatory guide is employed, a lubricant must be applied to a contact surface thereof, although, advantageously, the running distance thereof is relatively short. As has been described, as compared to the prior art stage device in which all of the stage mechanisms are arranged within the substrate processing space, in the stage device according to the present invention a scanning axis corresponding to 99.9% or more of the total running distance is disposed externally to the substrate processing space. Further, since the stepping axis stage is held stationary during substrate processing practical problems in its use are reduced.

By employing the configuration discussed above, a practically useful stage device can be provided.

Three objects to be taken into consideration in realizing the stage device described above will now be described below.

(1) Method for Securing a Vacuum Chamber

For processing or inspecting a substrate using an electron beam, the space into which the electron beam is irradiated must be held under a vacuum state. Thus, a vacuum chamber is provided. However, since an atmospheric pressure acts on an outer wall surface of the vacuum chamber the wall is liable to be deformed.

Two potential problems result. They are as follow:
i) deterioration in performance of the stage resulting from a deformation of the wall of the chamber due to the fact that after an initial adjustment of the stage device having been conducted in the space under the atmospheric pressure, an actual operation should be carried out in the vacuum condition; and
ii) deterioration in performance of the stage device as a result of fluctuation in atmospheric pressure.

(2) Method for Securing a Laser Interferometer

If a mounting reference plane is selected without sufficient consideration, there may be an increase in errors in detecting displacement using a laser interferometer owing to a pressure fluctuation acting on the chamber.

(3) Effect of Moisture Adhering to a Surface of a Member

Moisture adhering to a surface of a member communicating between the atmosphere and the vacuum via a differential exhaust seal may cause a reduction in a pressure in the chamber.

The present invention, in consideration of the matters discussed above, provides a practically usable stage device by employing a configuration of the stage device as described above and thereby solving respective problems as noted above.

To solve the problems set forth before, an angle detecting device for detecting a rotation angle of a rotating object according to the present invention comprises a target, a conversion means for converting a rotational displacement of the rotating object to a linear displacement in a specified direction for the target, and a detecting means for detecting the linear displacement of the target.

In the present invention, as the rotating object is rotated, the rotational displacement (rotation angle) of the rotating object is converted into linear displacement (linear distance) by the conversion means. The detecting means, such as a linear encoder or a linear sensor, detects the linear displacement of the target. Since there is a specified relationship between the rotational displacement of the rotating object and the linear displacement of the target, the rotation angle of the rotating object can be detected on the basis of the linear displacement of the target.

Preferably, the target may be a nonmagnetic material having a relative magnetic permeability of 1.01 or less. By way of this, the angle detecting device of the present invention can be applied in a preferred way to a variety of apparatuses which use an electron beam.

According to a preferred aspect of the present invention, the angle detecting device further comprises a support means for supporting the target in a manner that allows the target to have a degree of freedom of linear movement in the specified direction, and the conversion means has at least one degree of freedom of internal linear movement in a direction different from the specified direction and at least one degree of freedom of internal rotation.

According to this aspect, as the rotating object is rotated, the rotational action of the rotating object is transmitted to the target via the conversion means, while at the same time the support means supports the target so as to allow the target to have a degree of freedom of linear movement in the specified direction. At this time, the conversion means, in response to the action from the rotating object and the target, moves in the direction different from the specified direction with at least one degree of freedom of internal linear movement and thereby induce an internal displacement of rotation made by at least one degree of freedom of internal rotation. Thus, the rotational displacement of the rotating object can be smoothly converted into the linear displacement of the target.

Preferably, the conversion means has at least two roller bearings having different rotational axes, respectively, and the at least two roller bearings are disposed in contact with each other. According to this configuration, it may be more difficult for any undesired force acting in directions other than the proper linear movement direction to act against the target, and thereby a friction torque upon converting the rotational displacement into the linear displacement can be reduced. Further, in this configuration, a tolerance for a position alignment relative to each other of the at least two roller bearings may be extended. More preferably, the conversion means comprises an elastic element for maintaining the contact condition between the at least two roller bearings in a flexible manner.

The support means is, in one example, a leaf spring element attached to the target, and the leaf spring element exerts a substantial elastic force on the target in a direction different to the specified direction. By way of this, a smooth linear displacement of the target can be achieved. Further, a practically usable support means includes a linear guide means (e.g., an LM guide, a cross roller guide or a static pressure guide) for constraining a movement of the target to be a linear movement in the specified direction.

BRIEF DESCRIPTION OF THE DRAWINGS

FIG. 10A is a diagram illustrating deformation of a housing, while

FIGS. 18A to 18D are diagrams illustrating an improving scheme for a pressure fluctuation within a vacuum chamber resulting from a linear movement of a movable table of the Y-axis stage;

DETAILED DESCRIPTION OF THE INVENTION

Preferred embodiments of a stage device of the present invention will now be described with reference to the attached drawings.

Figure 1:
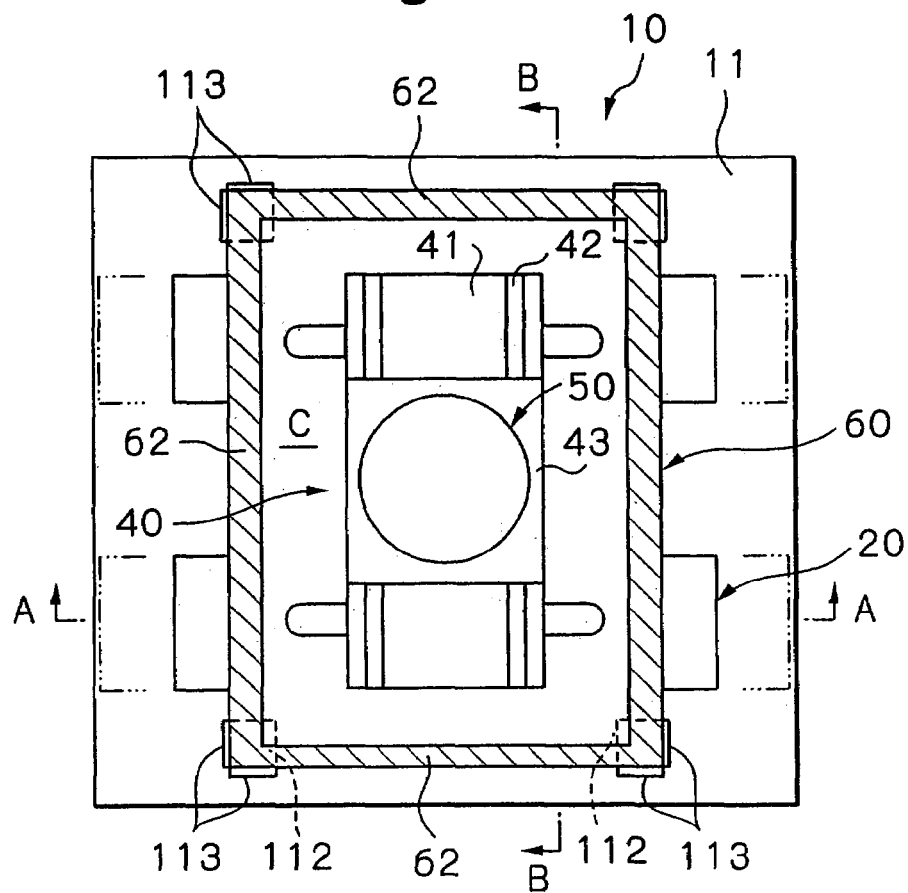
FIG. 1 is a plan view showing a stage device according to an embodiment of the present invention.
Figure 2:
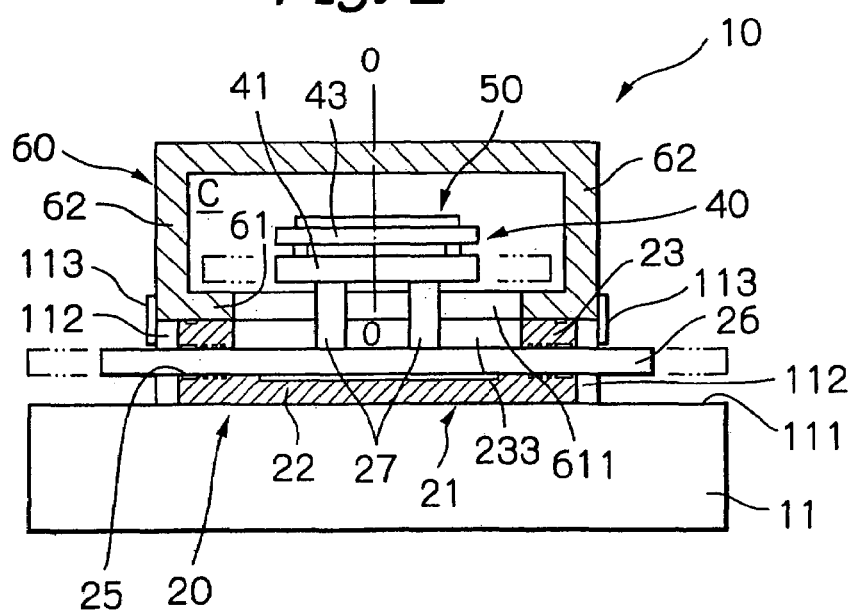
FIG. 2 is a sectional view taken along the line A—A of FIG. 1.
Figure 3:
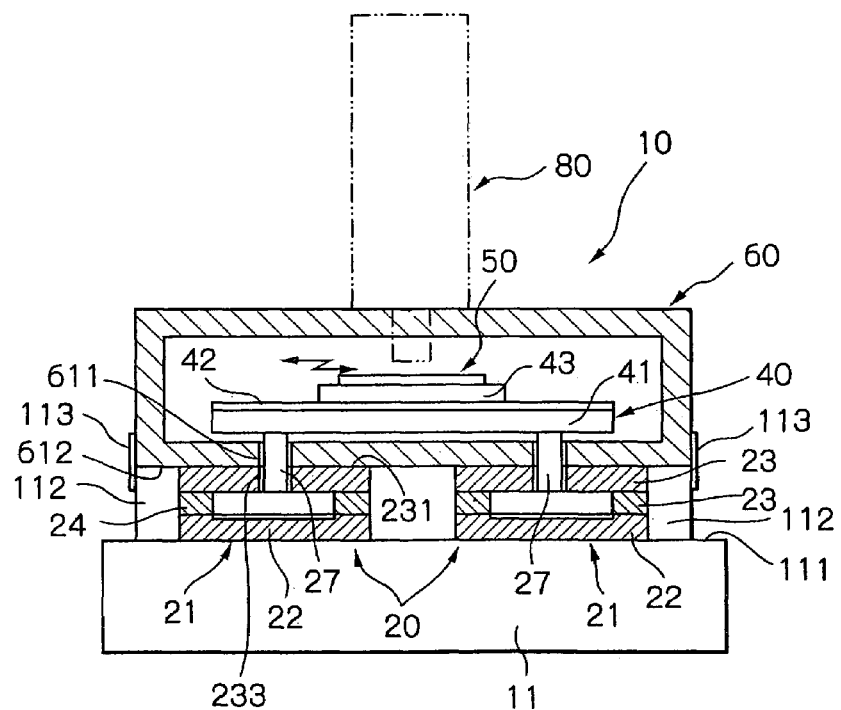
FIG. 3 is a sectional view taken along the line B—B of FIG. 1.

Referring to FIG. 1 to FIG. 3, a stage device according to an embodiment of the present invention is indicated generally by reference numeral 10. The stage device 10 comprises a rigidly fabricated base plate 11, a scanning axis or a Y-axis stage 20 mounted on the base plate 11, a stepping axis or an X-axis stage 40 mounted on the Y-axis stage 20, a Θ-axis stage 50 mounted on the Y-axis stage 20, and a housing 60 mounted on the Y-axis stage and defining a vacuum chamber "C" or a processing space, in which the X-axis stage 40 and the Θ-axis stage 50 are accommodated, each of the above components arranged in a positional relationship as shown in FIG. 1 to FIG. 3.

Figure 4:
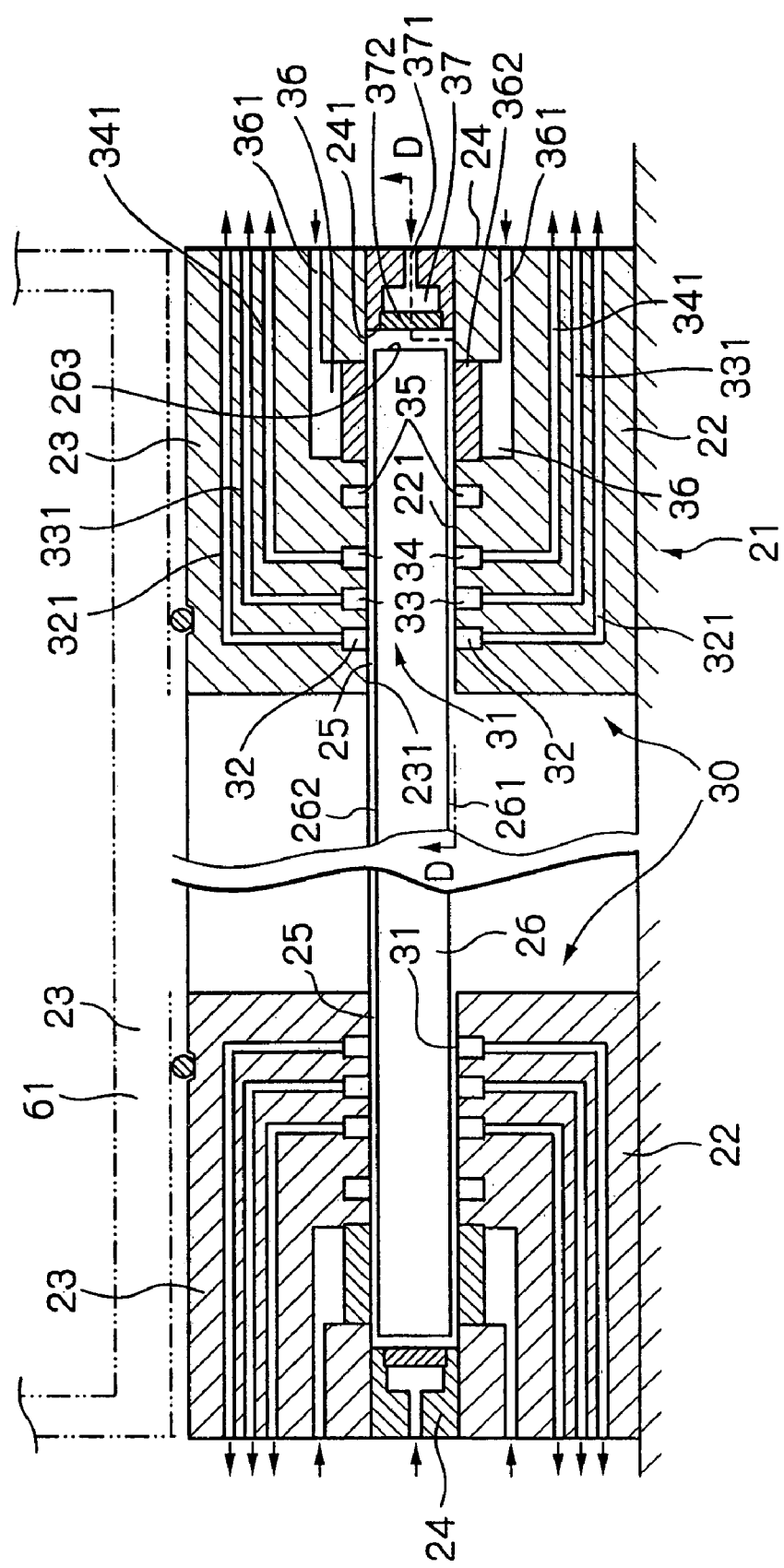
FIG. 4 is an enlarged sectional view showing a hydrostatic guide mechanism incorporated in a Y-axis stage illustrated in FIG. 2.
Figure 5:
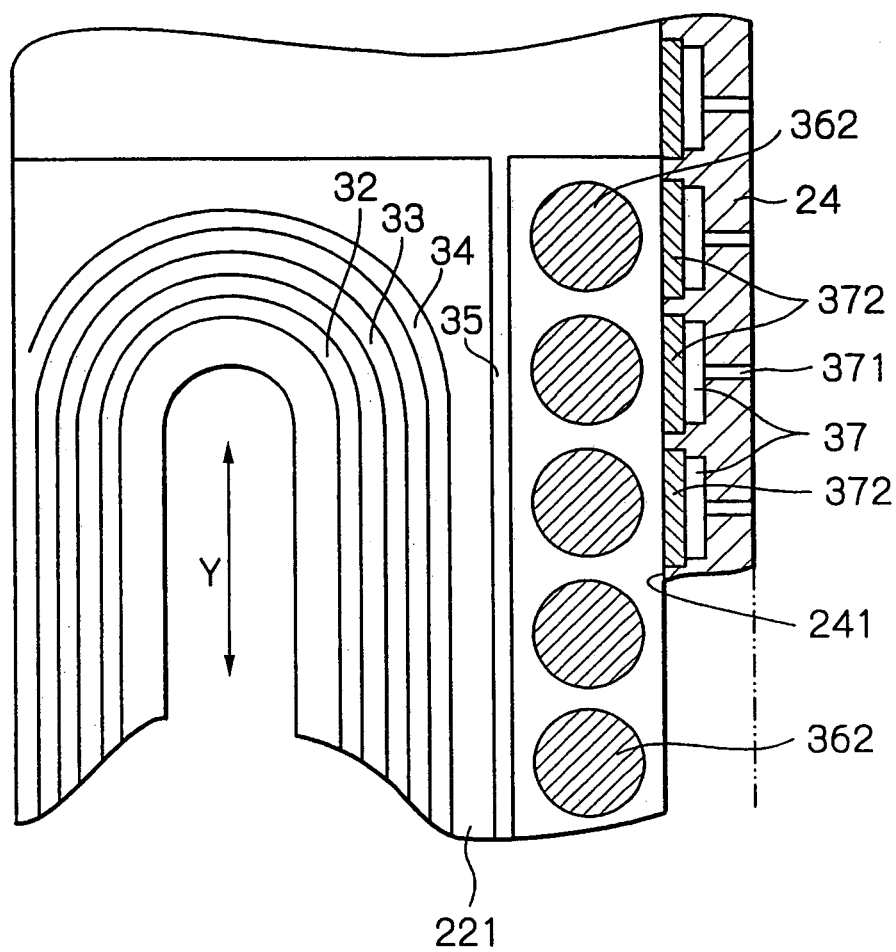
FIG. 5 is a diagram taken along the line D—D of FIG. 4.

Referring to FIG. 2 to FIG. 4, the scanning-axis stage or the Y-axis stage 20 comprises a fixed component or a stator section 21 fixed on a top surface of the base 1, and a plurality of movable components(two in this embodiment) or movable tables 26 arranged so that they can move linearly along the X-axis direction with respect to the stator section 21 (the left and right directions in FIG. 1 and FIG. 2). The stator section 21 is provided for each one of the movable tables, and each stator section 21 comprises a lower portion 22 fixed onto a top surface 111 of the base plate 11, an upper portion 23 and a plurality of intermediate portions 24 interposed between the lower and upper portions. A linearly extending through-passage 25 is formed between the lower portion 22 and the upper portion 23. The movable table 26 in the shape of flat plate is movably disposed in each passage 25.

Turning now to FIG. 1 to FIG. 5, the Y-axis stage is provided with a hydrostatic guide mechanism 30 including a built-in non-contact type rectangular sealing device 31. This hydrostatic guide mechanism 30 is provided for the passage 25 of each stator so as to guide the movable table 26 movably in a non-contact manner. The non-contact sealing device 31 of the hydrostatic guide mechanism 30 has grooves formed in an upper surface 221 of the lower portion 22 and an under surface 231 of the upper portion 23 of the stator 21 in respective locations facing to the passage 25; the grooves comprising a low pressure groove 32, an intermediate pressure groove 33, a high pressure groove 34 and a release groove 35, arranged in sequence from an inner side, respectively. The hydrostatic guide mechanism 30 further comprises a non-contact type hydrostatic bearing provided adjacent to the non-contact sealing device. The hydrostatic bearing has a plurality of openings 36 (appearing in circular from a plan view in FIG. 5) formed so as to be aligned linearly in parallel with the extending direction of the passage 25. The lower pressure groove 32, the intermediate pressure groove 33 and the high pressure groove 34 are made into a go-around loop configuration in plan view having a linear section and a curved section just like a track in athletics stadium, as shown partially in FIG. 4, and opened toward facing surfaces of the movable table 26 within the passage 25. As can be seen in FIG. 4, the lower pressure grooves, the intermediate pressure grooves, the high pressure grooves and the release grooves are located along a line that is symmetrical in orientation relative to each side of a longitudinal center axis line of the passage 25 or the movable table 26. The release groove extends linearly between the outer high pressure groove 34 and a plurality of openings 36. The lower pressure groove 32, the intermediate pressure groove 33 and the high pressure groove 34 are designed to be in communication with an exhaust pipe (not shown), respectively, through channels 321, 331 and 341 formed in the lower portion 22 and the upper portion 23. Further, respective openings 36 are designed to be in communication with a gas supply source via a gas feed pipe (not shown) through channels 361 formed in the lower portion 22 and the upper portion 23 for respective openings 36. A hydrostatic bearing pad 362 having a know structure is disposed within each opening 36.

The intermediate portion 24 are arranged in both sides of the stator so as to define the passage 25 together with the lower portion 22 and the upper portion 23, and in its inner surface (the surface located in the passage 25 side in FIG. 4) 241, a plurality of openings (circular shape in sectional view in this embodiment) 37 opening toward the passage 25 are formed along in the direction in which the intermediate portion extends, or in the direction in which the passage 25 extends. Each of the openings 37 is designed to be in communication with the gas supply source through a gas feed pipe (though not shown), through the channel 371 formed in the intermediate portion 24 for each opening. A hydrostatic bearing pad 372 having a known structure is disposed also in each of the openings 37. Respective openings, 36, 37 together with the hydrostatic bearing pads 362, 372 make up the hydrostatic bearings.

In the hydrostatic guide mechanism 31 having a structure as described above, a hydrostatic gas pressure acts against an under surface 261 and an upper surface 262 of the movable table 26 via the hydrostatic bearing pads 362, to thereby enable the movable table 26 to be maintained in a suspended state under the force generated by the gas pressure above the upper surface 221 of the lower portion of the stator 21, the movable table 26 being controlled not to come into contact with the under surface 231 of the upper portion 23 of the stator 21. Gaps (5 to 10 microns) generated between the movable table 26 and the lower and the upper portions 22, 23 of the stator 21 are maintained generally within a certain range. On the other hand, the hydrostatic gas pressure from the hydrostatic bearing pad 372 disposed in the intermediate portion 24 also acts against a side face 263 of the movable table 26 and helps maintain within a certain range a gap between the side face 26 and the inner face 241 of the intermediate portion 24 so as to prevent any contact between them. The gas delivered through the hydrostatic bearing pads 362 and 372 passes through those gaps into the release grooves 35 and exits through the release grooves 35 to the atmosphere. Also, the gas is partially exhausted through the high pressure grooves 34, the intermediate pressure grooves 33 and the lower pressure grooves 32. In the present embodiment, the non-contact sealing device structurally comprises the high pressure groove 34 (although it is referred to as a high pressure, it is in a vacuum side as compared with the atmosphere, meaning a lower vacuum), the intermediate pressure groove 33 (in an intermediate vacuum) and the lower pressure groove 32 (in a higher vacuum), and preferably those grooves are connected to different vacuum pumps respectively. This is because each groove is required to work with a different evacuation pressure and flow rate. By using such a configuration as described above, respective sections are subject to a pressure designated in sequence from high to low as: the hydrostatic bearing pad 362> the gas release groove 35> the high pressure groove 34> the intermediate pressure groove 33> the lower pressure groove 32> the vacuum. The use of these structures make it possible to realize a hydrostatically guided stage in which a non-contact seal is attained between an atmospheric space and a vacuum space, which are isolated from each other by means of a pressure bulkhead.

A plurality of support poles 27 (two in this embodiment) are fixed in an upright state onto the upper surface 262 of each movable table 26, as illustrated in FIG. 2. The support poles 27 extend through an elongated groove 233, which is formed to extend along the Y-axis direction (the left and right direction in FIG. 2) so as to be in communication with the passage 25 and the outside thereof, and also through another similarly shaped elongated groove 611 formed in a lower wall 61 of the housing 60 which is arranged over the stator and defines the vacuum chamber C functioning as the processing space. The support poles 27 further extend into the chamber C. The fixed component or the fixed plate 41 of the stepping axis or the X-axis stage 40 is secured to upper ends of the support poles 27 attached to respective movable tables 26.

In the above mentioned Y-axis stage 20, during operation, each movable table 26 is guided and supported so as to be movable in a non-contact state with the stator 21 within the passage 25 by the actions of the hydrostatic bearing pads 362, 372 of the hydrostatic guide mechanism 30. Also, owing to the action of the non-contact sealing device 31, the gas is prevented from flowing into the vacuum chamber C via the passage 25. Under such conditions, for example, if the movable table 26 is moved linearly by a drive mechanism such as a linear motor (not shown) connected to the movable table, the movable table 26 as well as the X-axis stage and the Θ-axis stage mounted thereon are able to be evenly moved.

Figure 6:
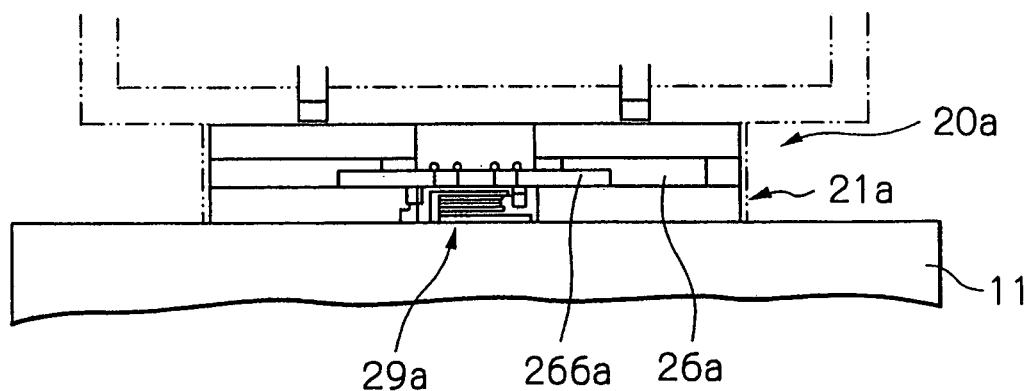
FIG. 6 is a side elevational view showing an alternative embodiment of the Y-axis stage.
Figure 7:
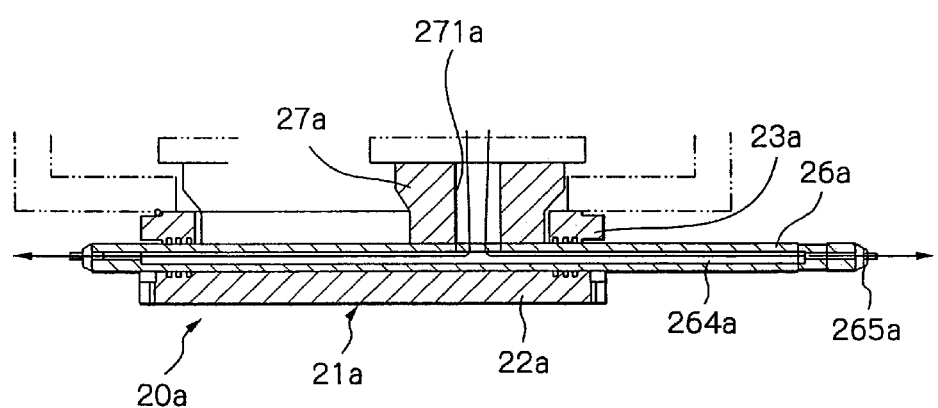
FIG. 7 is a sectional view of the Y-axis stage of FIG. 6, illustrating a section similar to FIG. 2.

FIG. 6 and FIG. 7 show an alternative embodiment of the Y-axis stage. A Y-axis stage 20a of this alternative embodiment is structurally different from the Y-axis stage illustrated in FIG. 2 and FIG. 3 in that two poles 27 disposed on respective movable tables are integrated into one bracket 27a on a movable table 26a and a through hole 271a is formed inside the bracket pole 27a. A bore 264a is also newly formed inside the movable table 26a, which extends in a longitudinal direction. The hole 271a is in communication with the bore 264a, which in turn continues with an end portion of the movable table 26a. This bore accommodates cables and/or pipes (including an air pipe and a vacuum pipe) associated with devices such as the X-axis stage, the Θ-axis stage and so on, which are located above the Y-axis stage, so that they may be laid through the bore. For example, the movable table 26a is equipped at the end portion thereof with a vacuum connector 265a for providing a seal between the vacuum space and the atmospheric space, and also for ensuring functionality of the cables and pipes. Alternatively, instead of the vacuum connector 265a, the seal between the vacuum space and the atmospheric space may be provided in the fixed plate 41 side of the X-axis stage, and a characteristic advantage in this case is that the inside of the movable table 26a is able to be utilized as a duct for wiring and piping.

Further, the movable table 26a is coupled with its adjacent movable table via coupling bars 266a provided at opposite ends thereof, to thereby together form a single unit. In addition, the coupling bar 266a is coupled with a linear motor 29a. This linear motor comprises a magnetostatic field magnetic circuit including a permanent magnet in the fixed section in the base 10 side, and a coil disposed in the movable section in the coupling bar side for generating a dynamic magnetic field. This coil has no york and is a so-called "coreless" type. This alternative embodiment is the same as that illustrated in FIG. 1 to FIG. 4, excluding the above described features, and accordingly, detailed description therefor will be omitted.

Figure 8:
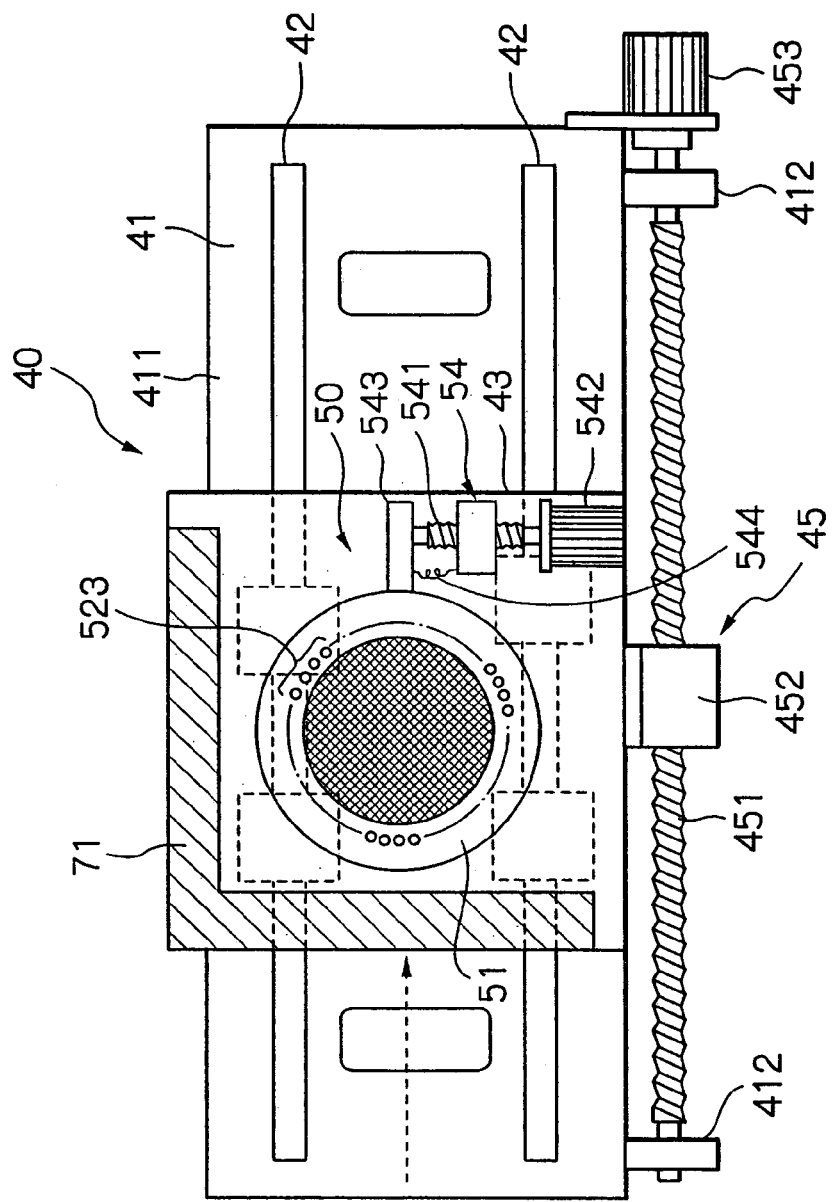
FIG. 8 is an enlarged plan view of an X-axis stage.
Figure 9:
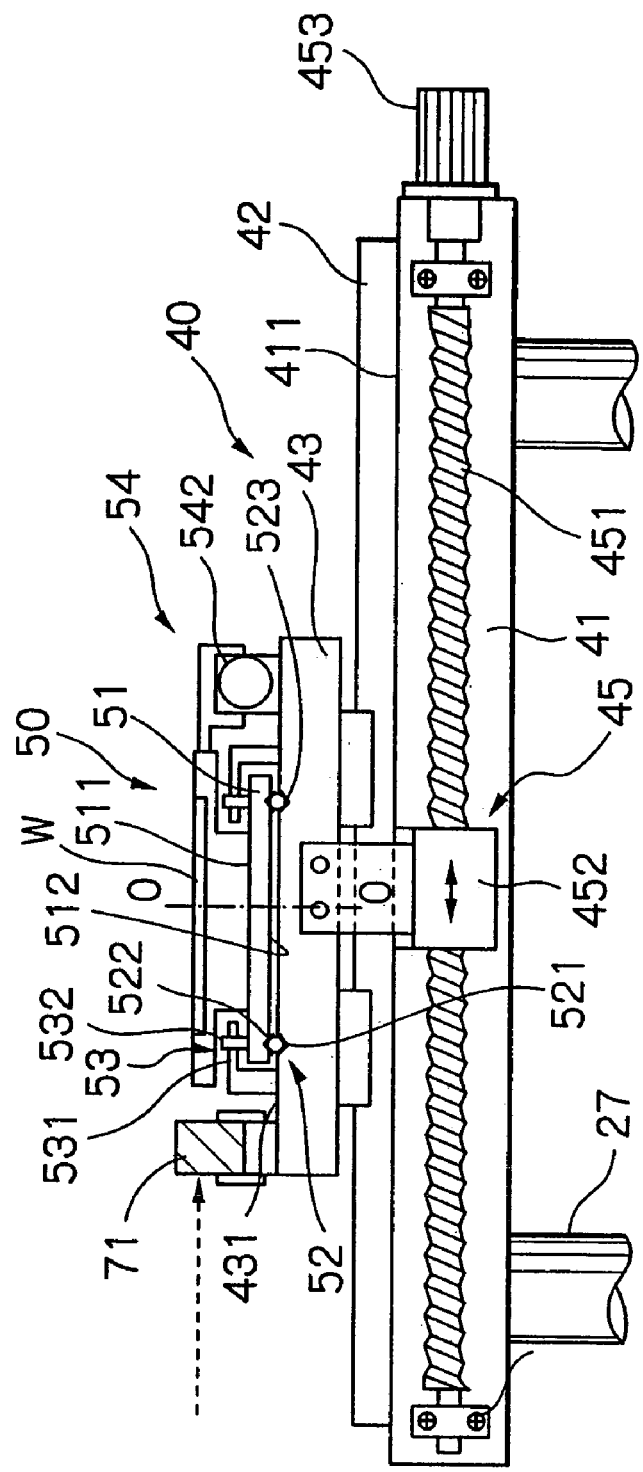
FIG. 9 is a side elevational view of the X-axis stage illustrated in FIG. 8.

FIG. 8 and FIG. 9 show a detailed configuration of the stepping axis or X-axis stage 40 and the Θ-axis stage 50. The X-axis stage 40 comprises a fixed table 41 secured to a plurality of support poles 27 on the movable table 26 of the Y-axis stage 20, a movable table 43 movably mounted on a pair of parallel linear LM guides or guide rails 42 arranged on an upper surface 411 of the fixed table, and a drive mechanism 45 for the movable table. The fixed table 41 has a rectangular form that is elongated in the X-axis direction (the left and right direction in FIG. 8), while the movable table 43 has an approximately form. A mirror 71 of a laser interference type displacement meter, which will be described later, is mounted on and along two sides of an upper face 431 of the movable table 43, the two side crossing with each other at a right angle. The driving mechanism 45 comprises a ball screw 451 which is rotatably supported by a pair of bearings 412 on a side portion of the fixed table 41 and extending along the X-axis direction, a ball nut 452 of a known structure which is mounted on a side portion of the movable table 43 corresponding to that of the fixed table 41 and is engaged with the ball screw 451, and a nonmagnetic supersonic motor 453 for revolving the ball screw 451.

The Θ-axis stage 50 comprises a circular plate-like rotary table 51 operatively mounted on the upper surface 431 of the movable table 43 of the X-axis stage 40 so as to turn freely around a vertical axis O—O as a center of rotation, a guide unit 52 for guiding the rotation of the rotary table 51, a retaining unit 53 for retaining the rotary table 51, and a drive mechanism 54 for driving the rotary table. The guide unit 52 is constituted of an annular guide groove 521 formed (around the axis O—O as a center) in the upper surface 431 of the movable table 43, a guide groove 522 correspondingly formed in an under surface 512 of the movable table 51, and a plurality of ceramic balls 523 rolling within both guide grooves and their associated retainers (not shown). The guide grooves 521, 522 are formed into either a V-shape or an inverse V-shape in respective cross-sections. There are three sets of ceramic balls and retainers, which are circumferentially spaced apart at a distance of 120 degrees around the circular guide grooves. These guide units may be of a known structure, and detailed description thereof will therefore be omitted. The retaining unit 53 comprises an arm member 531 disposed in association with the set in the upper surface 431 of the movable table 43, and a pressure roller 532 operatively attached to this arm member 531 so as to rotate freely with its outer surface being brought into contact with the upper surface 511 of the rotary table 51. The rotative drive mechanism 54 comprises a lead screw feeder 541 consisting of male and female lapping threads, and a non-magnetic supersonic motor 542 for driving the male screw of the lead screw feeder 541 to rotate, wherein a + (positive) rotary feed is applied to the rotary table 51 by pressing a protruded bar 543 attached to the outer periphery thereof and a − (negative) rotary feed may be applied thereto by a coil spring 544.

There are provided above the rotary table 51 with a wafer chuck for loading a substrate such as a wafer, a wafer pusher for raising the wafer slightly above the chuck surface so as to convey the wafer onto/out of the stage device by using a robot arm, and so on. It is to be noted that since some of the related element are not within the scope of the present invention description thereof is omitted.

A discussion is now directed to three points for realizing a stage device designated above.

1. Method for Securing a Vacuum Chamber

To carry out a processing operation or an inspection of a substrate using an electron beam, it is required that a space into which the electron beam is irradiated must be under a vacuum state. To realize this requirement, the housing 60 defining the vacuum chamber C may be provided, as described above. However, there is a problem arising from the fact that an atmospheric pressure is acting on the outer wall surface of the housing, and a difference between the pressure acting within the chamber and the pressure acting on the outer wall surface may result in deformation of the wall.

This problem may further lead to two serious problems as previously described in (1) i) and ii) of the summary section. In this regard, deformation occurring in the housing wall will be described with reference to FIG. 10.

Figure 10A:
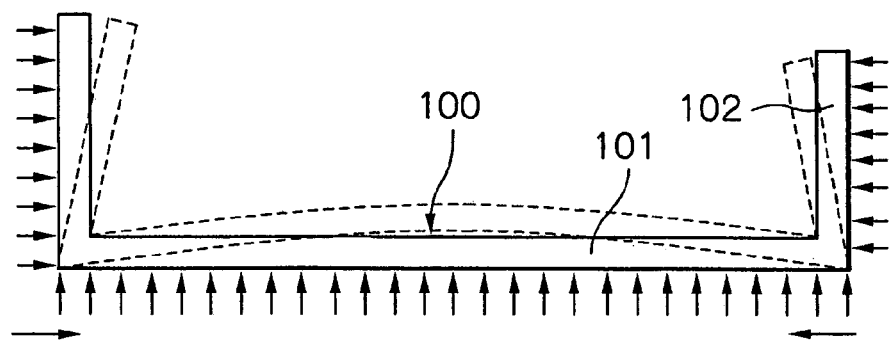
Figure 10B:
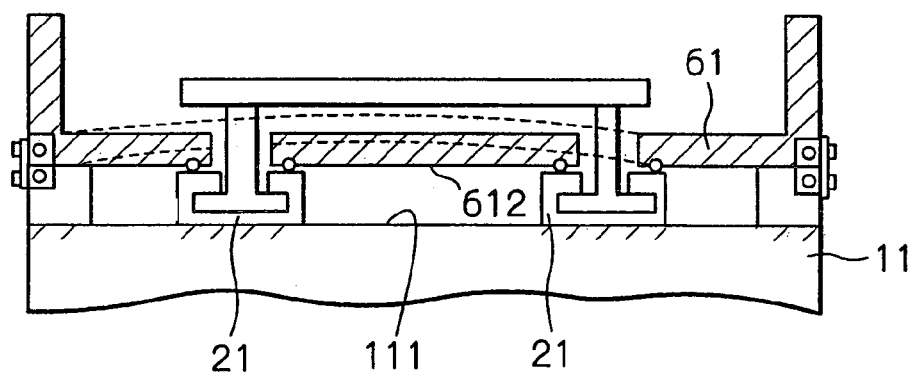
FIG. 10B is a diagram illustrating a measure taken against the deformation.

In FIG. 10[A], for simplicity of explanation, the description is made for a lower half of the housing 60, specifically with regard to a case where a member 100 having a concave U-shape, as designated by the solid line, is deformed. When the force acting on the member 100 from the inside thereof and the force acting on the member 100 from the outside thereof are equal, a bottom wall 101 and side walls 102 located at the left and the right (in FIG. 10) of the bottom wall 101 are held a flat state, as indicated by the solid lines. However, if an additional uniform force acts on the outer surfaces of the bottom wall 101 and the side walls 102, the bottom wall and the left and the right side walls may be deformed, as indicated by the broken lines (it is to be noted here that while actual deformation visible to the naked eye is small, it is depicted in the drawing in extended scale).

Assuming that a pressure difference of 0.1 MPa acts on an area of 1 m² as a uniformly distributed load, then a total of acting force is equivalent 10,000 kg. If this force applied to a 50 mm thick steel pate of 1 m×1 m, a maximum distortion of about 0.2 mm would be induced. However, it is clearly seen from FIG. 10 that corner portions or connections between the bottom wall and the side walls are subjected only to extremely small deformations. Accordingly, considering that the housing 60 has a cubic box-like form, it will be readily apparent that a corner of the wall will be subjected to the least amount of deformation. Thus, when the housing is secured to the base plate 11 at the corner portions thereof, the effect caused by deformation of the housing to the mounting reference plane on the base plate can be minimized.

From this fact, in the method for securing the housing 60 to the base plate 11 according to the present invention, as shown in FIG. 2 and FIG. 3, a set-up table 112 is installed and fixed onto the upper surface 111 of the base plate 11 in locations corresponding to the four corners of the bottom wall 61 of the housing 60, and the housing is mounted on the set-up table 112. Then, four side walls 62 of the housing and the set-up table 112 are secured to each other by using a coupling plate 113 and bolts (not shown).

In this regard, a case will be considered in which the stator section 21 of the Y-axis stage 20 is rigidly secured to the bottom wall of the housing 60, which could be deformed as indicated in FIG. 10[B]. This is assuming a case where as a securing means, bolts are employed. If the chamber C is evacuated to create a vacuum therein, the bottom wall 61 of the housing 60 would be deformed into the shape indicated by the broken lines. As a result, the stator 21 secured by means of bolts would be pulled by the bottom wall of the housing. Consequently, the upper surface of the base plate 11 or the base surface 111, which functions as the reference plane and to which the stator 21 of the Y-axis stage is secured, would also be pulled, and the base surface may thereby be seriously damaged.

To avoid this problem, in the present invention a structure is employed in which the stator 21 of the Y-axis stage is coupled to the bottom wall 61 of the housing 60 not rigidly but with a gap existing therebetween. Since with this structure, air may flow into the chamber from the gap between the bottom wall 61 and the upper portion 23 of the stator 21 via the elongated groove 611, a sealing device in the form of an elongated loop-around groove is provided between the under surface 612 of the bottom wall 61 and the upper surface of the upper portion 23.

Figure 11A:
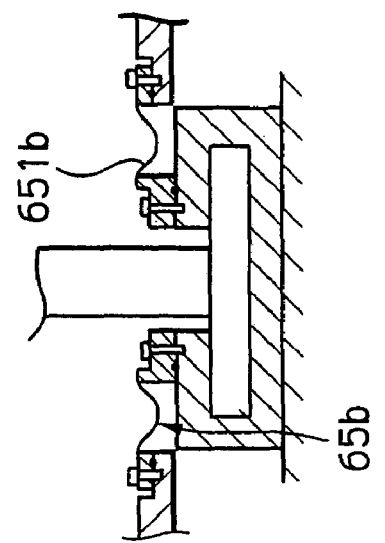
FIGS. 11A to 11C are diagrams illustrating a seal unit to be arranged between the Y-axis stage and the housing.
Figure 11B:
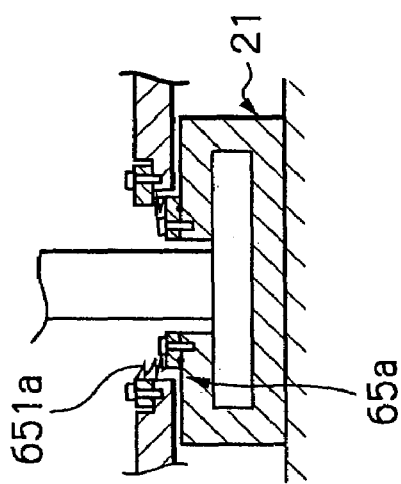
Figure 11C:
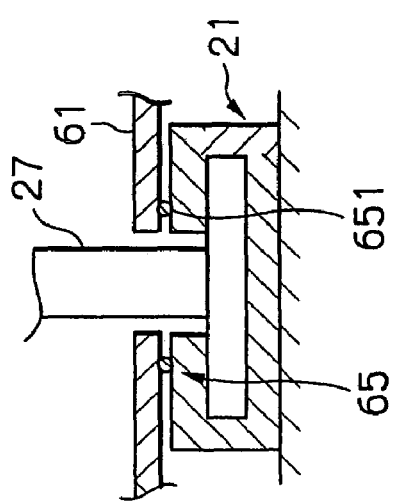

FIG. 11 shows three different examples of a sealing device 65 for sealing the gap between the bottom wall 61 of the housing 60 and the upper portion 23 of the stator 21. A sealing device 65 illustrated in FIG. 11[A] is representative of an example using, what is called, an O-ring seal 651. A relatively thicker O-ring seal 651 is employed. Specifically, in order to deal with a variation in gap between the chamber and the stator surface, the O-ring seal should be selected that is thick enough to ensure a sufficient collapsible dimension of 15 to 20% for a maximum gap between the chamber and the stator surface, and a collapsible dimension of 20 to 25% for a minimum gap therebetween. In this case, shallow grooves for accommodating the O-ring seal 651 may be arranged in the under surface 612 of the bottom wall 61 and the upper surface 231 of the upper portion 23 so as to facilitate positioning of the O-ring seal 651. A sealing device 65a illustrated in FIG. 11[B] is representative of another example in which a bellow type sealing member 651a is employed. This bellow type sealing member 651a is cylindrical in form to allow one end thereof to be sealingly fixed to the bottom wall 61, and the other end thereof to be sealingly fixed to the upper member. A sealing device 65b illustrated in FIG. 11[C] is representative of still another example using a diaphragm type sealing member 651b. From a viewpoint of cost, use of an O-ring type seal is preferable. However, in a case that the chamber is opened to the atmosphere relatively infrequently, from a viewpoint of operational life, the bellow type seal is preferable.

2. Method for Securing a Laser Interferometer

Figure 12:
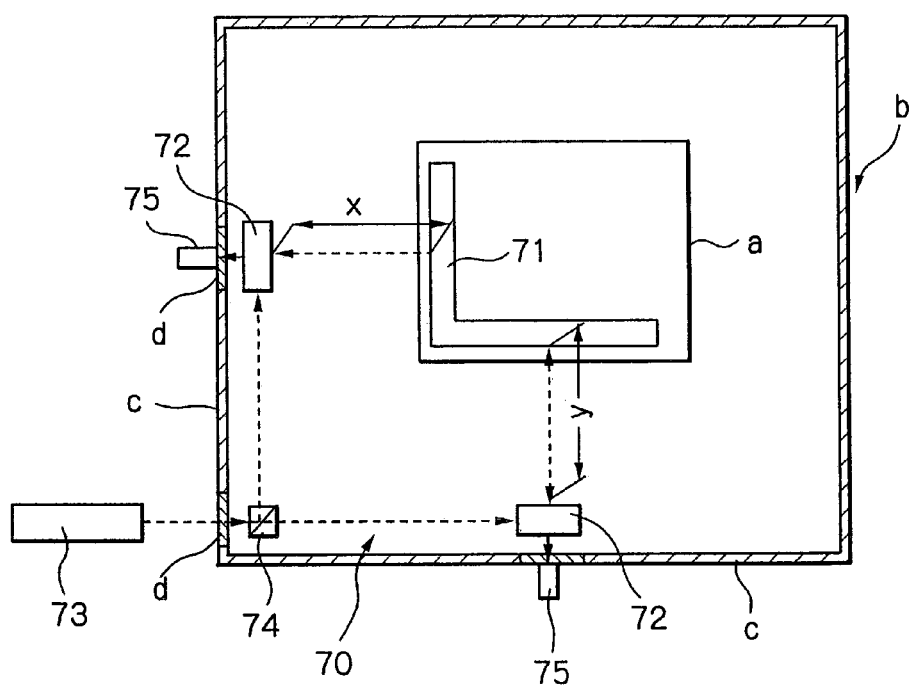
FIG. 12 is a diagram illustrating a relationship between a laser interference type displacement meter and a stage device.

In the next section, there will be described a method for securing a laser interferometer that is able to detect a position of the movable table of the stage device (i.e., the movable table capable of being displaced in the X-axis direction as well as in the Y-axis direction, wherein it is defined as the movable table of the X-axis stage if the X-axis stage is mounted on the Y-axis stage but defined as the movable table of the Y-axis stage in the opposite case) with a high resolution and also in a long stroke. FIG. 12 shows one example of a typical configuration for detecting displacement in the X-axis and the Y-axis direction.

For easy of explanation, a simplified configuration of the system will be described. The square vacuum chamber C contains a top level movable table "a". A mirror 71 for a laser interference type displacement meter 70 is arranged on the movable table "a" to measure displacements of the movable table along the X-axis and the Y-axis and to control positioning thereof. In this illustrated example, an L-shaped bar mirror is used. Since respective components making up the laser interference type displacement meter 70 are common in this general explanation and also in the embodiments of the present invention, the same reference numerals are used in the explanation. Opposite the mirror 71, an interferometer 72 is disposed in the vicinity of the inner surface of a side wall "c" of a housing "b" defining the vacuum chamber, and relative displacement of the mirror 71 with respect to the interferometer 72 is detected.

To do this, a laser light source 73 is provided externally to the housing "b", and a laser beam emitted from the laser light source 73 is introduced through a window "d" into the chamber C where it is split into two directions by a beam splitter 74. Each of the laser beams enters the interferometer 72 where each laser beam is further split into a further two beams, respectively. One of the laser beams split within the interferometer 72 is directed to the mirror 71 to be reflected back to the interferometer 72. At this time, the other laser beam previously existing within the interferometer is mixed with the returning laser beam to produce a mixed laser beam which is in turn received by a receiver 75. The laser beam received by the receiver 75 is processed in a signal processing circuit, and signals which are physical quantities and correspond displacement in the X-axis direction and the Y-axis direction, are output. This is the laser interference type displacement meter.

The physical relationship between the interferometer 72 and the mirror 71 is of great importance. Therefore, it is important to ensure that the interferometer 72 is appropriately disposed such that a signal corresponding to a detected displacement includes a displacement of the movable table to be measured and also any displacement of the interferometer.

Figure 13:
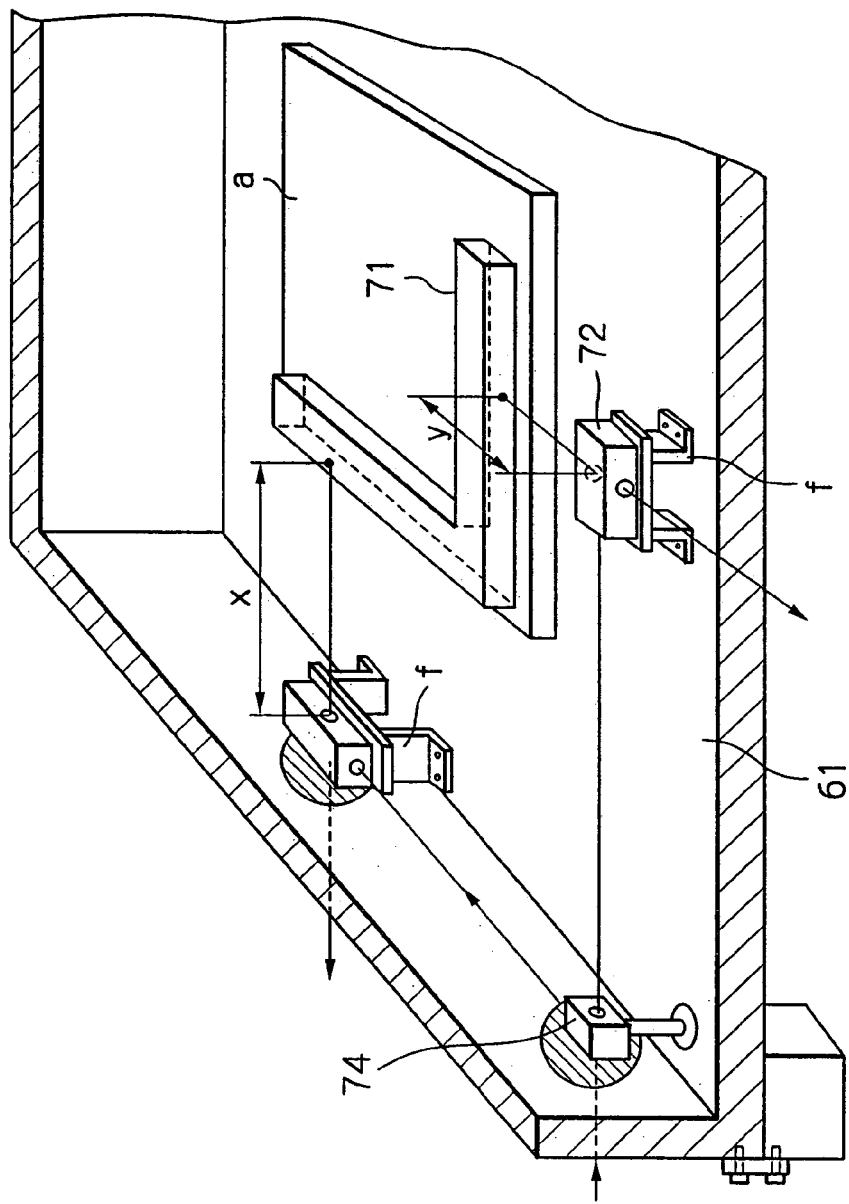
FIG. 13 is a diagram illustrating how to mount components of a laser interference type displacement meter according to a prior art.

FIG. 13 shows an example of a method for disposing the above-mentioned components of the laser interference type displacement meter according to the prior art. Typically, the interferometer 72 is installed and secured to the upper surface of the bottom wall of the housing by a pedestal "f", or alternatively the pedestal may be suspended from the upper wall of the housing (not shown).

However, it can be said that a wall of the housing is deformed, as described previously, by the pressure acting thereon, and deformation of the walls is subjected to a change in atmosphere pressure, which results in change in deformation from time to time. Accordingly, the method for securing the interferometer as illustrated in FIG. 13 is not preferable.

In the present invention, this problem is solved by the means described below.

Figure 14:
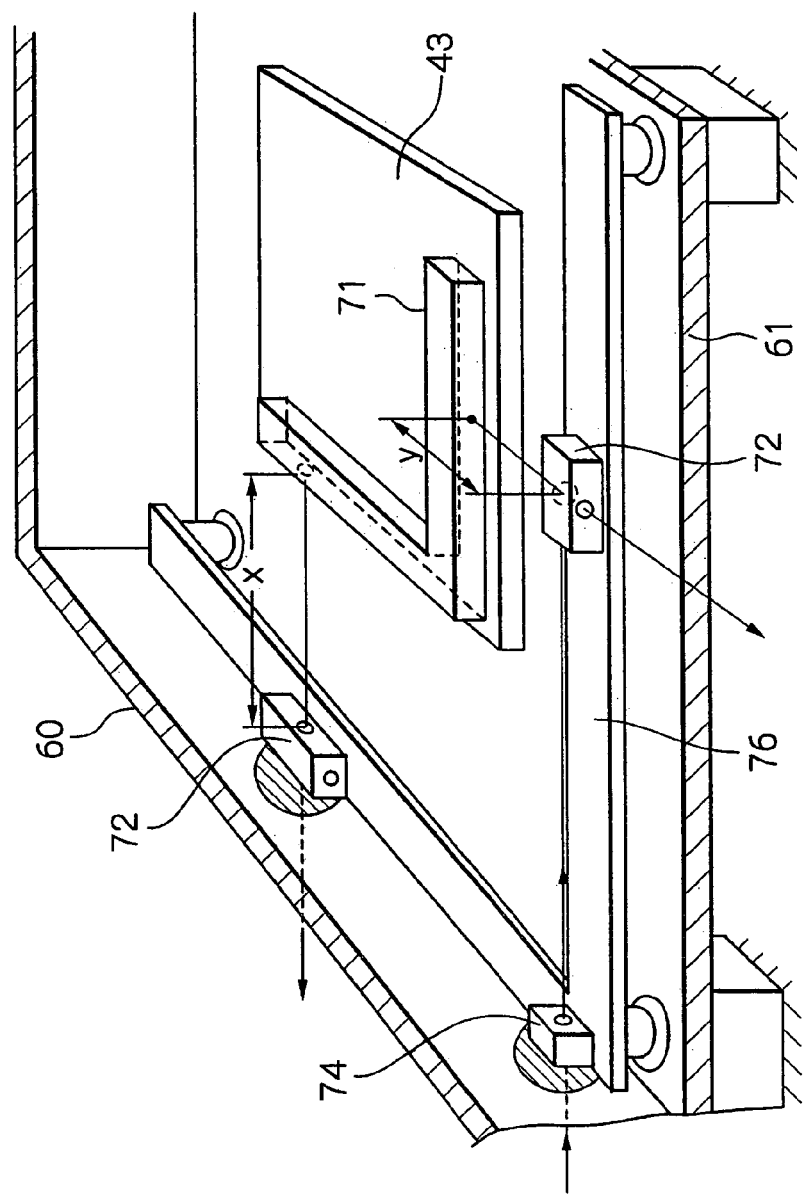
FIG. 14 is a diagram illustrating how to support components of a laser interference type displacement meter according to the present invention.

FIG. 14 shows an example of a method for securing the interferometer by using a surface of the housing, as a reference plane, which is least susceptible to deformation. Thus, as discussed above, the housing 60 is secured to the base plate 11 at each of its four corners which are least susceptible to deformation. In the present example, a configuration is employed, in which an L-shaped mounting base 76 (which corresponds in function to the pedestal) supported at three points located in one of the four corners of the bottom wall (supported at both ends and at a corner bent at a right angle) is arranged in the chamber C, and the interferometer 71 of the laser interference type displacement meter 70 to be installed in the stage device of the present invention is mounted on that L-shaped mounting base 76. The beam splitter 72 can also be mounted on the mounting base 76, to thereby facilitate an adjustment of their respective heights relative to one another. Thus, in the present invention employes the structure, in which the portions in the chamber which is least susceptible to deformation are selected as the reference plane for mounting the components of the interferometer. It is to be noted that the structure of the L-shaped mounting base is not limited to the example specified in the drawing, and any structure may be employed in so far as it can bring about the same effect.

Figure 15:
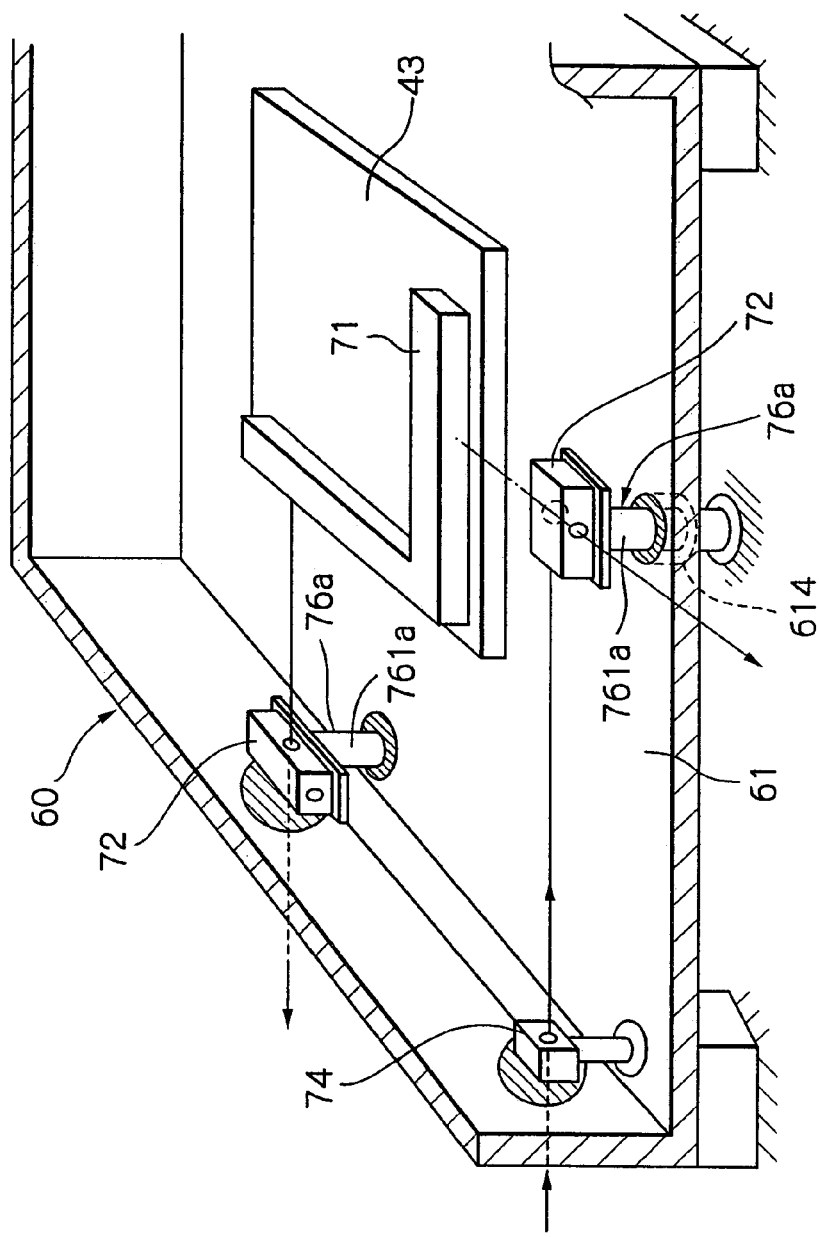
FIG. 15 is a diagram illustrating an alternative method how to support components of a laser interference type displacement meter according to the present invention.
Figure 16A:
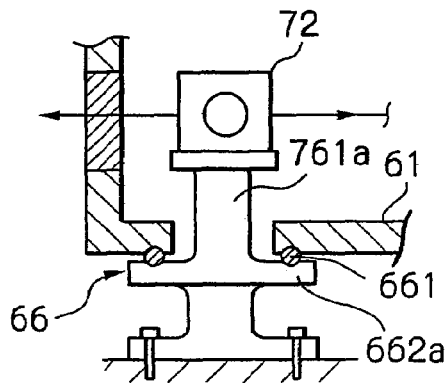
FIGS. 16A to 16D are diagrams illustrating a seal unit for sealing a gap between a pedestal for an interferometer of a laser interference type displacement meter and a housing.
Figure 16B:
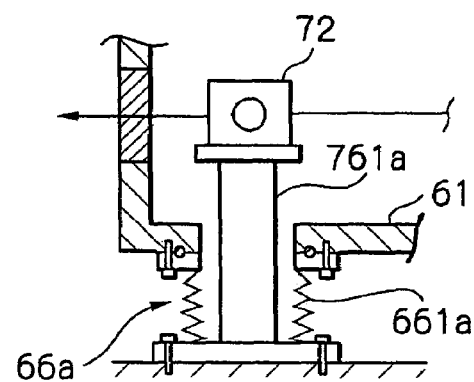
Figure 16C:
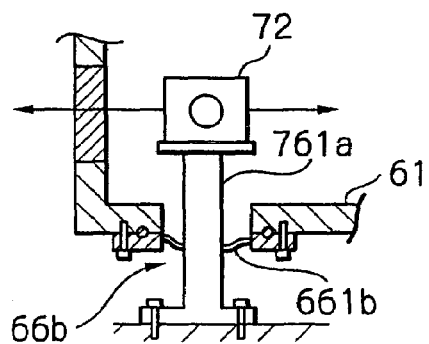
Figure 16D:
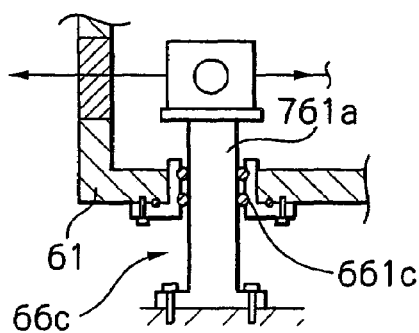

FIG. 15 shows an example for securing the interferometer by using the upper surface 111 of the base plate 11 as the reference plane. In this example, the interferometer 72 is mounted on the pedestal 76a, and the pedestal 76a has a support pole section 761a extending through a through hole 614 formed in the bottom wall 61 of the housing 60 and secured at a lower end of the support pole section 761a to the upper surface 111 of the base plate 11. A sealing device is provided between the through hole formed in the bottom plate of the chamber and the penetrating member of the pedestal 76a for sealing the gap formed between the bottom wall 61 of the housing and the support pole section of rod shape of the pedestal 76a extending through the through hole 614 of the bottom wall 61.

In FIG. 16, some examples of a sealing device 66 for sealing the above described gap are shown. FIG. 16[A] shows an example of a sealing device 66 comprised of an O-ring 661. A standard to be applied in selecting a thickness of this O-ring seal 661 is the same as that described in relation to the O-ring seal example of the sealing device 65. A flange section 762a is formed in the pedestal 76a, and the flange section 762a and the bottom wall 61 of the housing 60 are spaced with an interposing gap being sealed by the O-ring seal 661. FIG. 16[B] shows another example in which in a sealing device 66a a cylindrical bellow 661a is employed as an elastic sealing member, and one end of the bellow is sealingly fixed to the lower end of the bottom wall, while the other end of the bellow is sealingly fixed to the base. Further, FIG. 16[C] represents still another example, in which in a sealing device 66b a diaphragm 661b is employed as an elastic sealing member, and an inner periphery of the diaphragm is sealingly secured to the pedestal, while an outer periphery thereof is sealingly secured to the bottom wall. Further, FIG. 16[D] represents still another example of a sealing device 66c made up of an O-ring seal 661c, in which two O-ring seals are disposed within the through hole, wherein each seal is in sealing-contact at an outer peripheral side thereof with the member of the bottom wall side while in sealing-contact at an inner peripheral side thereof with an outer surface of the support pole section of the pedestal. If the deformation of the bottom wall of the housing is considered as being mainly composed of a component extending in a vertical direction, then selecting the O-ring having a good sliding ability rather than the relatively thicker O-ring may still achieve the desired sealing performance. As a smooth-sliding O-ring, for example, a "Slidable O-ring" listed in the barely commodity catalogue "CAT. NO. 5100" from NTN may be used advantageously.

3. Prevention of Moisture from Adhering to a Surface of a Movable Table

With regard to providing a hydrostatic bearing and a differential exhaust seal in a scanning axis or a Y-axis stage 20, the following discussion will be made with reference to FIG. 17.

A stage device according to the present invention comprises a Y-axis stage 20 including a stator section 21 and a movable table 26 extending through the stator section 21, wherein the movable table 26 is, as described previously, guided by a hydrostatic guide mechanism 30, with a differential exhaust seal or a non-contact sealing device 31 being provided between a vacuum space within a vacuum chamber C and an atmospheric space in which a hydrostatic bearing or the like is provided. A piping for the differential exhaust seal is connected to the stator section 21 side. Thus, the movable table 26 can be driven in the scanning direction or the Y-axis direction by means of a driving source (not shown) which may be disposed in the atmospheric space.

Figure 17:
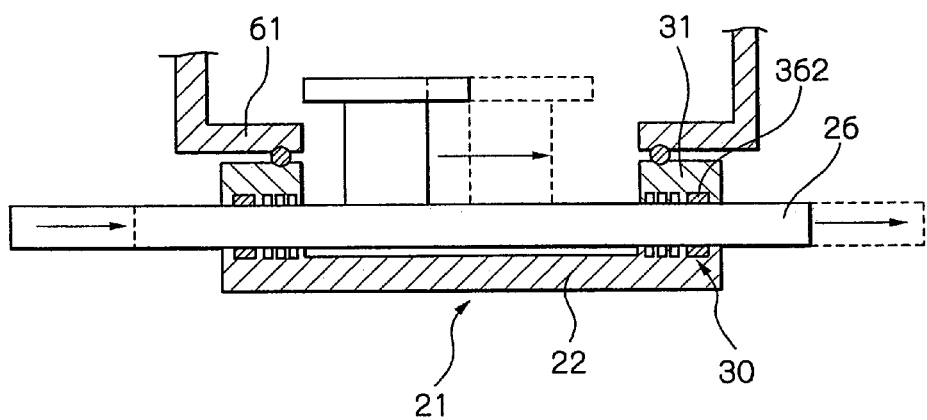
FIG. 17 is a diagram illustrating a pressure fluctuation within a vacuum chamber resulting from a linear movement of a movable table of the Y-axis stage.

In the above configuration, when the movable table 26 is currently in a state indicated by the solid line in FIG. 17 (this state is referred to as an initial state), a surface of the left side portion of the movable table is maintained in a clean atmosphere. Then, the movable table is moved toward the right up to a position designated by the broken line, where a portion of the surface of the movable table which has been previously exposed to the atmosphere is now exposed to a vacuum, as a result of the movement.

As a result of experiment, deterioration in a pressure within the chamber C has been confirmed in synchronism with a cycle of movement. In this regard, a trend of a chamber pressure fluctuation was measured for each of three different gas used to fill the space for the entire unit respectively.

(1) Industrial nitrogen gas (99.9999% purity)=very dry gas
(2) Dry air (Compressed air further dried by a dryer for a hydrostatic bearing)
(3) Typical clean atmosphere (Air having a moisture content in the range of 50%)

As a result, the trend of pressure fluctuation is indicated as (3)>>(2)>1=0. The case (2) has been improved to be around 1/10 of the case (3). From this result, it has been found that a main factor affecting the pressure fluctuation is the moisture or moisture.

In one simple countermeasure to be taken, the outer side of the unit may be entirely covered with a very dry gas. However, in order to achieve a platen surface having good flatness, typically a stone platen is employed. Since a natural stone is used, the moisture control is necessary for maintaining the precision, and typically the moisture content of 50% is preferred.

An exemplary structure to solve the problem in a simple way with a small modification is shown in FIG. 18. In this configuration, in order to reduce an amount of moisture adhering to the surface of the movable table 26, a moisture barrier plate 29 is arranged on and secured to an end face surrounding an opening periphery of the passage 25 of the stator 21. FIG. 18[A] shows the state of the movable table that has been moved to the left side end. The moisture barrier plate 29 may be provided in a structure consisting of separate upper and lower parts or in an integral structure (having a rectangular through hole) surrounding the periphery of the movable table 26.

In FIG. 18[A], although the hatching portion defined in the left side end of the movable table 26 is exposed to the atmosphere, when it is moved toward the right, the surface of the movable table (of the hatched portion) which has been exposed to the clean atmosphere would not be exposed to the vacuum, as shown in FIG. 18[B].

FIG. 18[C] is a diagram illustrating a function of the moisture barrier plate 29. The moisture barrier plate 29 is located in the stator section, and this stator section contains the hydrostatic bearing inside thereof. This hydrostatic bearing is supplied with dry air (2) used in the previous experiment. In addition, this system is designed such that the dry air may be injected into the passage via the hydrostatic bearing pad of the hydrostatic bearing disposed adjacent to the opening of the passage. This dry air must be discharged to the atmosphere side through the passage. Accordingly, a dried gas is supplied in the vicinity of the moisture barrier plate 29. By directing the exhaust path of this dried gas along the surface of the movable table 26 with the aid of the moisture barrier plate 29, a double advantageous effect can be obtained.

Further, aiming for a highly efficient hydrostatic bearing, if the flow rate of the discharged dry air is low and a sufficient moisture blocking effect on the surface of the movable table can not be obtained, then a shower nozzle 29' for supplying a dry gas may be provided in a location adjacent to the moisture barrier plate 29, as shown in FIG. 18[D].

Figure 19:
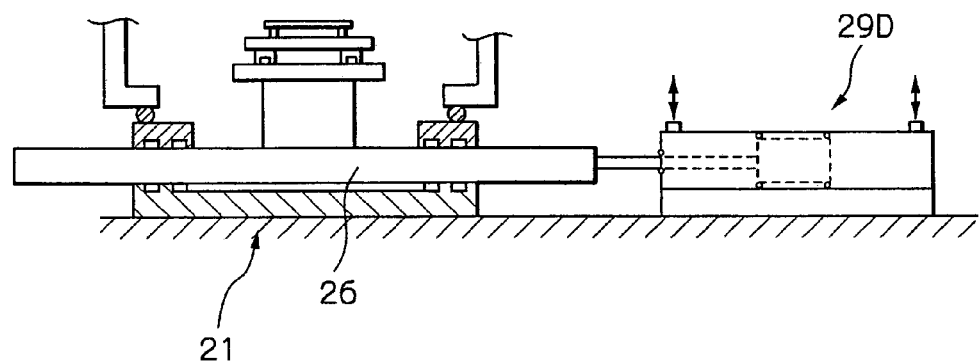
FIG. 19 is a diagram showing an alternative drive mechanism of a movable table of the Y-axis stage.

Now, an alternative embodiment of a driving source for a movable component of the scanning axis stage device is shown in FIG. 19. It is very important that driving of the movable component of the scanning axis stage device performance among the driving performances of the scanning axis should be effected evenly at a constant speed. Further, to achieve precise positioning of the movable component, it is necessary to inhibit heat developed by the driving source. Still further, a large thrust is required to attain sufficient response control. As a driving source that is able to satisfy these three requirements, a hydraulic cylinder 29b is the most suitable. The hydraulic cylinder 29b uses a liquid as a working fluid, which is a non-compressible fluid and is able to be easily controlled. In addition, positioning with a higher degree of precision and movement stability can be obtained by guiding the cylinder itself of the hydraulic cylinder by using the working fluid.

For more detail, see, for example, the following reference: H. J. J. Kraakman et. al. "A Precision lathe with hydrostatic bearings and drive", PHILIP TECHNICAL REVIEW, Vol. 30, No. 5, 1969.

In the above stage device 10, a substrate to be processed is retained by a retainer (not shown) mounted on the rotary table 51 of the Θ-axis stage 50. In this condition, a charged beam is irradiated from a charged beam apparatus 80 shown in FIG. 3 so as to carry out processing of the substrate. Before starting this processing, if it is intended to position the substrate with respect to the charged beam apparatus, the Y-axis stage, the X-axis stage and the Θ-axis stage are to be operated in the manner as described above for the positioning of the substrate. If it is intended to move the substrate at a step of a certain distance with respect to the charged beam apparatus in the course of the processing, then the movable table 41 of the X-axis stage 40 may be moved to carry out the step movement. Further, if it is intended to carry out processing while successively moving the substrate, then a pair of movable tables 26 of the Y-axis stage may be successively moved.

Figure 20:
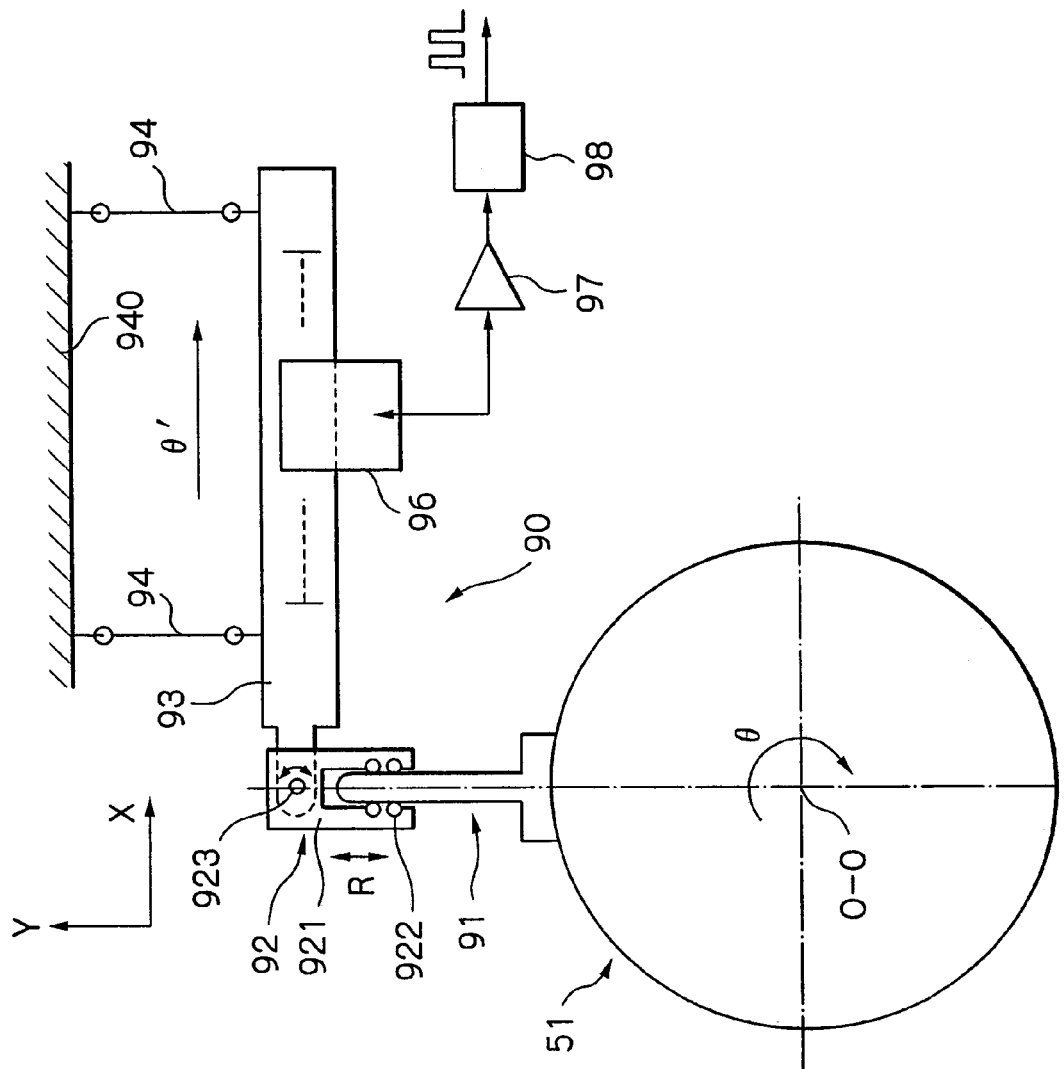
FIG. 20 is a schematic diagram illustrating a configuration of a main portion of an angle detecting device according to a first embodiment of the present invention.

FIG. 20 shows a main portion of an angle detecting device 90 according to a first embodiment of the present invention. The main portion comprises an angle-line conversion rod 91 which is fixedly attached to an outer periphery of the rotary table 51 of, for example, the Θ-axis stage having a rotational axis O—O and extends along a radial direction thereof, a nut 921 operatively coupled to the rod 91 via roller elements 922 so as to be slidable along a longitudinal direction of the rod 91 or the radial direction of the rotary table 51, a target 93 rotatably coupled to the nut 921 via a link element or pin 923, and two leaf spring elements 94, each coupled at one end to the target 93 and at the other end to a fixed section 940. The nut 921, the roller elements and the link element constitute a conversion device 92 for converting a rotational displacement of the rod 91 to a linear displacement of the target 93. It is to be noted that a relationship between the rod 91 and the nut 921 is similar to that between a ball spline shaft and its nut.

The angle detecting device further comprises a detector 96 for detecting a linear moving distance of the target 93, a preamplifier 97 for amplifying an output from the detector, a signal converter 98 also referred to as a counter or a detector for converting the signal amplified by the preamplifier 97 into a rectangular wave signal indicative of a physical quantity of displacement of the target 93. It is to be noted that the detector 96 may employ any arbitrary configuration well known to those skilled in the art, which may include, for example, an optical light-emitting element, an optical photo light-accepting element and a reflective mirror, if needed.

An operation of the angle detecting device 90 of FIG. 20 will now be described. In this drawing, similarly to FIG. 29, the lateral direction (the direction for measuring the movement of the target 93) on paper represents the X-axis direction, the upward direction represents the Y-axis direction and the direction orthogonal to the paper represents the Z-axis direction, respectively.

As the rotary table 51 is rotated by an angle "θ" around the rotational axis O—O, the rod 91 is revolved in association with this rotation of the rotary table. The action from the revolution of the rod 91 may be decomposed into the Y-axis directional component and the X-axis directional component. On the other hand, two leaf spring elements 94 work to hold the orientation of the target 93 in the up and down direction by their elastic forces. Thus, the revolving action of the rod 91 forces the nut 921 to slide with respect to the rod 91 in the radial direction "R" with the aid of the roller element 922 and also forces the target 93 to rotate with respect to the nut 3 with the aid of the link element 923. Accordingly, only the action of the rod 91 in the X-axis direction can advance the target 93 in the X-axis direction without any stick-and-slip motion. More precisely, since the leaf spring element 94 rotates around the point of support located above the fixed portion 940 as the center of rotation when the target 93 is moved by the rod 91 in the X-axis direction, a displacement of the target 93 in the Y-axis (upward) direction may also occur, through it is a small displacement. In the illustrated embodiment, the leaf spring 94 has been originally designed to be long enough to make it possible to neglect this displacement in the Y-axis (upward) direction. It is to be noted that the term "the leaf spring 94 . . . long enough to make it possible to neglect this displacement" means that the leaf spring 94 has sufficient length to make it possible to ignore this displacement with respect to the length of a slit arranged on the target 93 of the linear encoder.

Thus, the rotation angle θ of the rotary table 51 can be converted into the linear displacement θ' of the target 93 in the X direction, without substantially causing any inclinatory motion around the Z-axis and/or the Y-axis. In the detector 96, the light signal from the optical light-emitting element that has passed through the slit of the target 93 during this linear displacement θ' can be detected by the photo light-accepting element and thus detected signal is amplified in the preamplifier 97. This amplified signal is converted into the rectangular wave signal indicative of the physical quantity of displacement by the signal converter 98. A processing unit in a subsequent step, though not shown, calculates the linear displacement θ' from the rectangular wave signal and then calculates the rotation angle θ of the table 51, based on a given relation.

Figure 21:
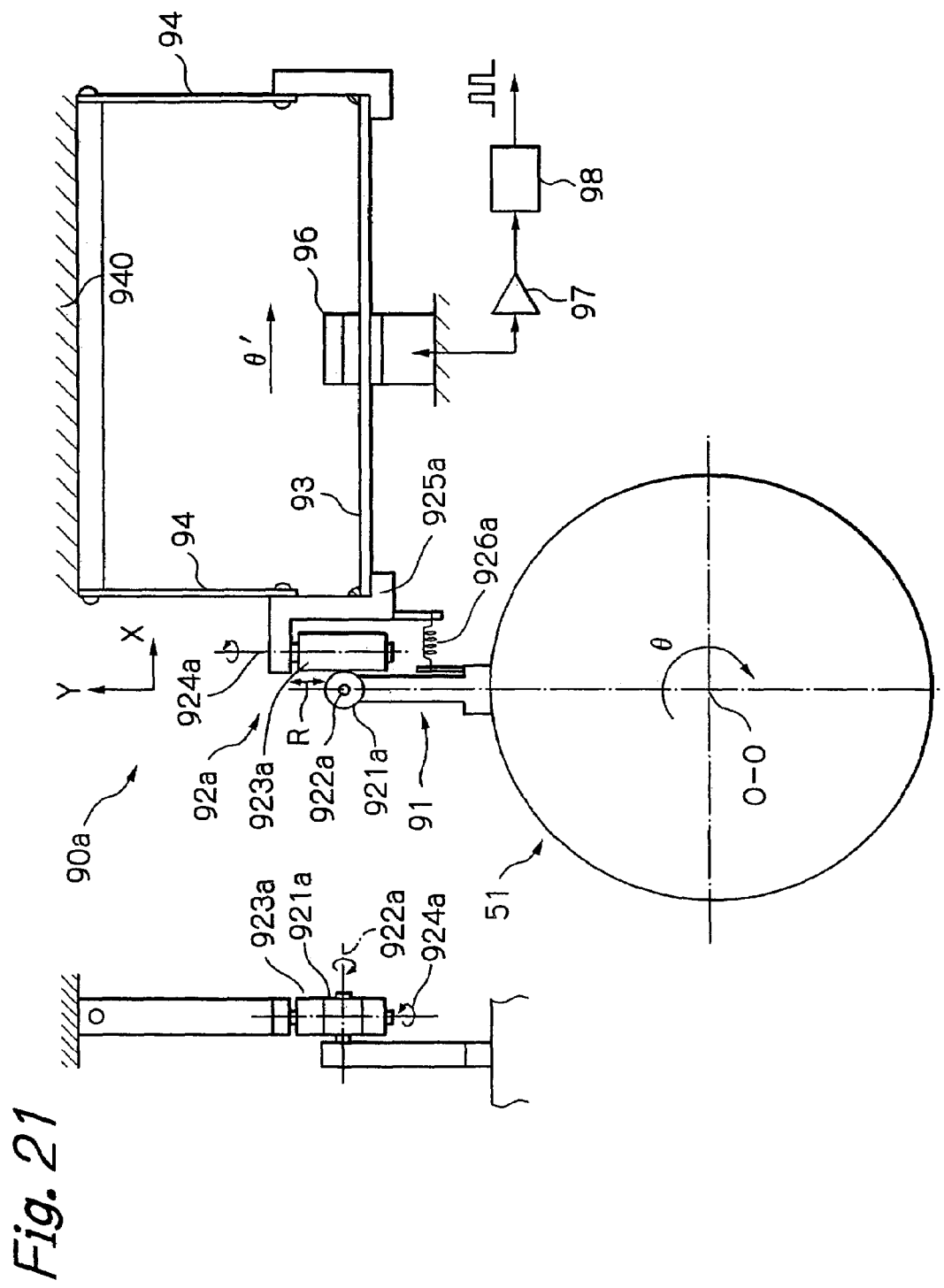
FIG. 21 is a schematic diagram illustrating a configuration of a main portion of an angle detecting device according to a second embodiment of the present invention.

FIG. 21 shows a main portion of an angle detecting device 90a according to a second embodiment of the present invention. It is to be noted that components similar to those in FIG. 20 are designated by the similar reference numerals and the detailed description for those components will be omitted but will be given to a different portion.

In an angle detecting device 90a shown in FIG. 31, a first roller bearing 921a is mounted on a top end of a rod 91 fixedly attached to an outer periphery of a rotary table 51, and the roller bearing 921a has a rotational axis 922a arranged to be orthogonal to the longitudinal direction of the rod 91. Further, a second roller bearing 923a is supported by a support member 925a in such a condition that the second roller bearing 923a can be rotated around a rotational axis 924a arranged to be orthogonal to the rotational axis 922a. The first roller bearing 921a and the second roller bearing 923a constitute a conversion device 92a for converting a rotational displacement of the rod 91 to a linear displacement of the target 93. The first roller bearing 921a and the second roller bearing 923a are in point-to-point contact with each other under a condition where the rotational axis 922a and the rotational axis 924a are arranged to be orthogonal to each other. This may allow the second roller bearing 923a to slide freely in the longitudinal direction of the rod 91 or the radial direction "R" of the rotary table 51 in a smooth manner. In order to maintain the point-to-point contact between the first roller bearing 921a and the second roller bearing 923a to be stable, a coil spring 926a is arranged between the rod 91 and the support member 925a. It is to be noted that preferably the rotational axis 922a of the first roller bearing 921a is approximately parallel to the rotational axis of the rotary table 51.

A target 93 is attached to the support member 925a, which in turn is supported by one of two leaf spring elements 94. A detector 96 may be configured similarly to that in the first embodiment.

In an angle detecting device 90a according to the second embodiment, since the device has such a mechanism in which two roller bearings 921a, 923a having different rotational axes from each other are provided so as to be in point-to-point contact with each other, any additional displacement components which otherwise could be induced in the conversion of the angular displacement θ of the rotary table 51 into the linear displacement may be released away in an efficient manner. That is, this embodiment provides a structure which makes it difficult for any undesired forces in a direction other than the proper linear moving direction to act on the target 93 in the linear encoder. Further, this mechanism can reduce a friction torque in a link section upon converting the angular displacement into the linear displacement and allows a tolerance for the positioning of the first roller bearing 921a and the second roller bearing 923a relative to each other to be extended.

Figure 23A:
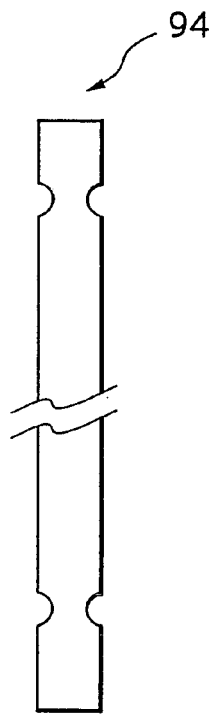
FIGS. 23A and 23B are diagrams showing some examples of leaf springs in different designs to be used in the angle detecting device according to either one of the first through the third embodiment of the present invention.
Figure 23B:
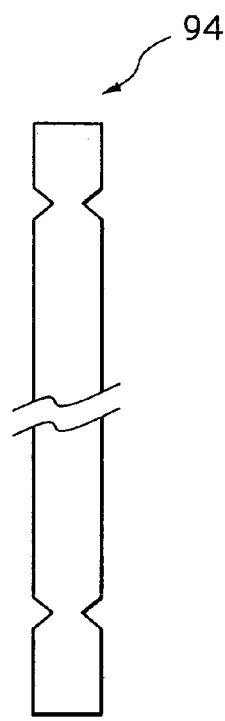

The leaf spring element 94 may be made of simple thin plate, and preferably a notch may be formed in the leaf spring in order to weaken the spring rigidity in the X-axis direction, as shown in FIGS. 23A and 23B.

Figure 22:
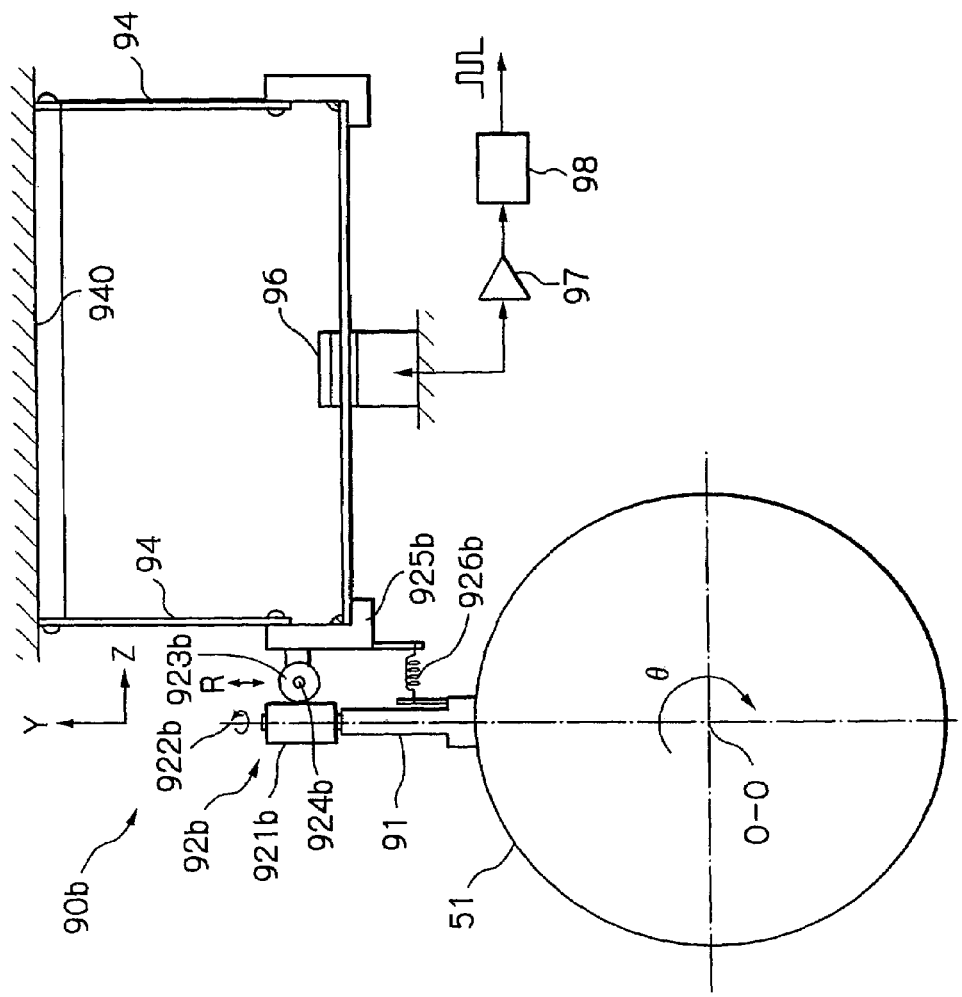
FIG. 22 is a schematic diagram illustrating a configuration of a main portion of an angle detecting device according to a third embodiment of the present invention.

FIG. 22 shows a main portion of an angle detecting device 92b according to a third embodiment of the present invention. The third embodiment is a modification of the second embodiment discussed above, and so components similar to those in the second embodiment are designated by the like reference numerals and detailed descriptions of them will be omitted.

Also in the third embodiment, a first roller bearing 921b and a second roller bearing 923b are arranged so as to be in point-to-point contact with each other. The first roller bearing 921b and the second roller bearing 923b constitute a conversion device 92b for converting a rotational displacement of the rod 91 to a linear displacement of the target 93. However, a rotational axis 922b of the first roller bearing 924b extends in the longitudinal direction of a rod 91 or in the radial direction of a rotary table 51, while a rotational axis 924b of the second roller bearing 923b is oriented to be orthogonal to the rotational axis 922b. That is, those rotational axes of the first and the second roller bearings 921b, 923b according to the third embodiment are oriented in the directions, respectively corresponding to the rotational axes of the first and the second roller bearings in the second embodiment shown in FIG. 21 that have been rotated by 90 degrees, respectively. Such a configuration also can bring about a operational effect similar to that by the second embodiment.

Figure 24:
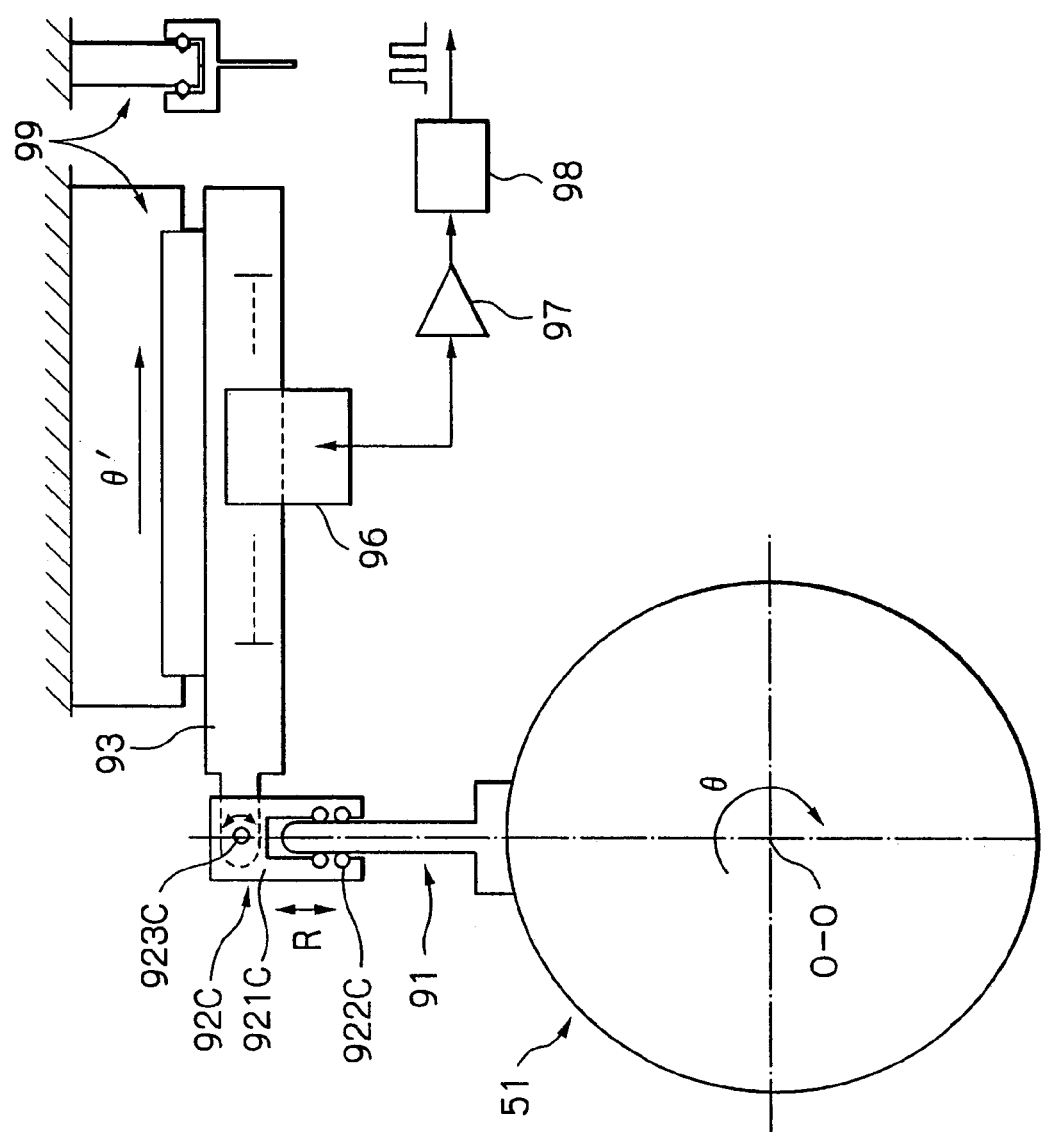
FIG. 24 is a schematic diagram illustrating a configuration of a main portion of an angle detecting device according to a fourth embodiment of the present invention.

FIG. 24 shows a main portion of an angle detecting device 90c according to a fourth embodiment of the present invention. Again, components similar to those in the respective embodiments discussed above are designated by like reference numerals and the detailed descriptions of them will be omitted.

This fourth embodiment is characterized in that in the first embodiment, the leaf spring element 94 has been replaced with a linear guide means 99. This linear guide means 99 permits a degree of freedom of movement for a target 93 exclusively in the θ' direction (i.e., the X-axis direction) but constrains the degree of freedom in the other directions. This linear guide means 99 may include, for example, a known LM guide, a roller guide represented by a cross roller guide and a non-contact guide represented by a hydrostatic bearing.

When the respective embodiments discussed above are to be applied to a substrate processing apparatus using an electron beam, preferably the leaf spring 94 should be made of beryllium copper (BeCu) material. Further, preferably a ceramics ball or a ceramic roller may be employed for the roller bearing element 922. Still further, preferably a ceramic spring may be used for the coil spring 926a, 926b. In addition, as the material having the relative magnetic permeability=1.01 or lower may be employed a WC alloy (tungsten-carbide alloy), a Ti alloy, TiC+Al$_2$O$_3$, Al$_2$O$_3$ and so on. In this regard, the SUS304 has the relative magnetic permeability=1.01–1.09. With this arrangement, the present invention can provide more preferable condition for the electron beam apparatus which is not allowed to use any magnetized components in the movable unit side thereof.

As for the linear encoder, preferably a "Laser Scale" available from Sony Precision Technology, Inc. may be employed. This linear encoder has a lower magnetic characteristic and a higher resolution (for reference only, Model No.=detecting section: BS77-NS-30, detector: BD15-T16). With the combination of the above-described conversion mechanism with this linear encoder, a signal of 2.76 nm/pulse can be obtained.

Further, the embodiment shown in FIG. 21 or FIG. 22 can provide a rotation angle-straight line displacement conversion mechanism with the rotational resistance against the rotary table 1 having been reduced unlimitedly. For example, the selected rotary drive mechanism exhibited a torque performance in the range of 1 Nm at maximum, and the rotational resistance lower than 10% of that could be accomplished.

Finally, when the detecting device of the present invention is to be applied to a rotary table mounted on an XY stage within an exposing apparatus, which is one of the semiconductor manufacturing apparatus, it is recommended that the direction defined as a stepping axis of the XY stage should be matched to the direction indicated by the arrow "Y" in FIG. 3 and FIG. 4. The purpose of doing so is to avoid inducing any irregular displacement in the target 5 during the operation of the stepping axis.

By using the angle detecting device discussed above, a superior angle detecting device with an angle resolution of 0.2 seconds as well as a dynamic range of ±2 degrees has been successfully achieved.

Figure 25:
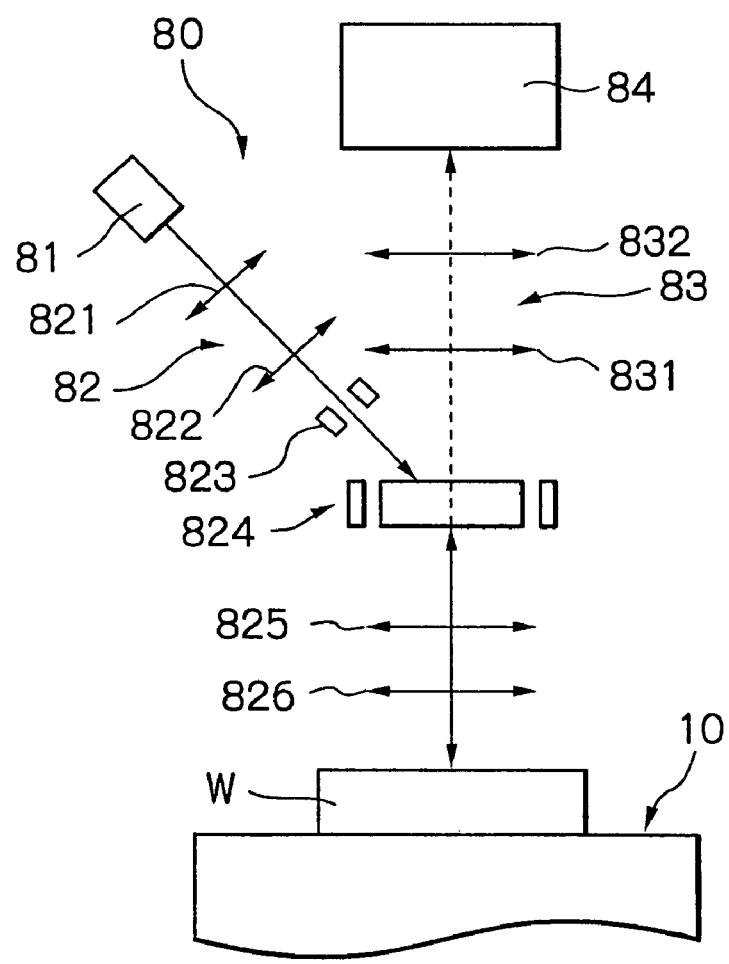
FIG. 25 is a general schematic view of a charged beam apparatus to be used for processing of a substrate together with the stage device according to the present invention.

Turning now to FIG. 25, an example of the charged beam apparatus 80 will be explained. The charged beam apparatus 80 comprises an electron gun 81 for emitting a charged beam, a primary optical system 82 for irradiating the charged beam emitted from the electron gun 81 against a sample such as a substrate "W" loaded on the stage device, a secondary optical system 83 into which secondary electrons emanated from the sample are introduced, and a detector 84. The primary optical system 82 comprises a lens system consisting of two-stage electrostatic lenses 821, 822 for focusing the charged beam emitted from the electron gun 81, a deflector 823, a Wien filter or an E×B separator 824 for deflecting the charged beam so that an optical axis thereof may be directed to be normal to a plane to be irradiated, and a lens system consisting of a two-step of electrostatic lenses 825, 826, wherein all of these components of the primary optical system 82 are disposed in order from the electron gun 81 placed in the topmost location so that the optical axis of the charged beam may be inclined with respect to a line orthogonal to a surface of the sample "W" (a sample surface), as shown in FIG. 20.

The secondary optical system 83 is designed as an optical system into which the secondary electrons emanated from the substrate W are introduced, and comprises a lens system consisting of a two-step of electrostatic lenses 831, 832 disposed above the E×B separator 824 of the primary optical system. The detector 84 detects the secondary electrons transmitted through the secondary optical system 83.

The charged beam emitted from the electron gun 81 is shaped properly in a square opening of the electron gun and contracted by the lens system of two-step lenses 821 and 822, and then the optical axis of the contracted charged beam is adjusted by the deflector 823 so as to form the beam into a square image with respective sides of 1.25 mm on a deflecting center plane of the E×B separator 824. The E×B separator 824 is designed so that an electric field and a magnetic field cross at right angles within a flat plane orthogonal to a normal line of the sample, wherein when a relation among the electric field, the magnetic field and the energy of electrons satisfy a certain condition, the electrons are allowed to continue along their path proceed straight ahead; but in a case other than the above, the electrons are deflected to a predetermined direction depending on the mutual relation among the electric field, the magnetic field and the energy of electrons. That is, the E×B separator 824 has been set so as to allow the charged beam emitted from the electron gun to enter vertically into the sample W and also allow the secondary electrons emanated from the sample to proceed along their path toward the detector 84. The shaped beam deflected by the E×B separator is contracted to ⅕ in size with the lens system 67, 68 and irradiated onto the substrate. The secondary electrons emanated from the sample W with the data for a pattern image contained therein are magnified with the lens systems 826, 825 and 831, 832 so as to form a secondary electron image on the detector 84. These four-step of magnifying lenses are designed to make up a non-distortion lens since the lens system of 825 and 826 forms a symmetrical tablet lens and also the lens system of 831 and 832 forms another symmetrical tablet lens.

Figure 26:
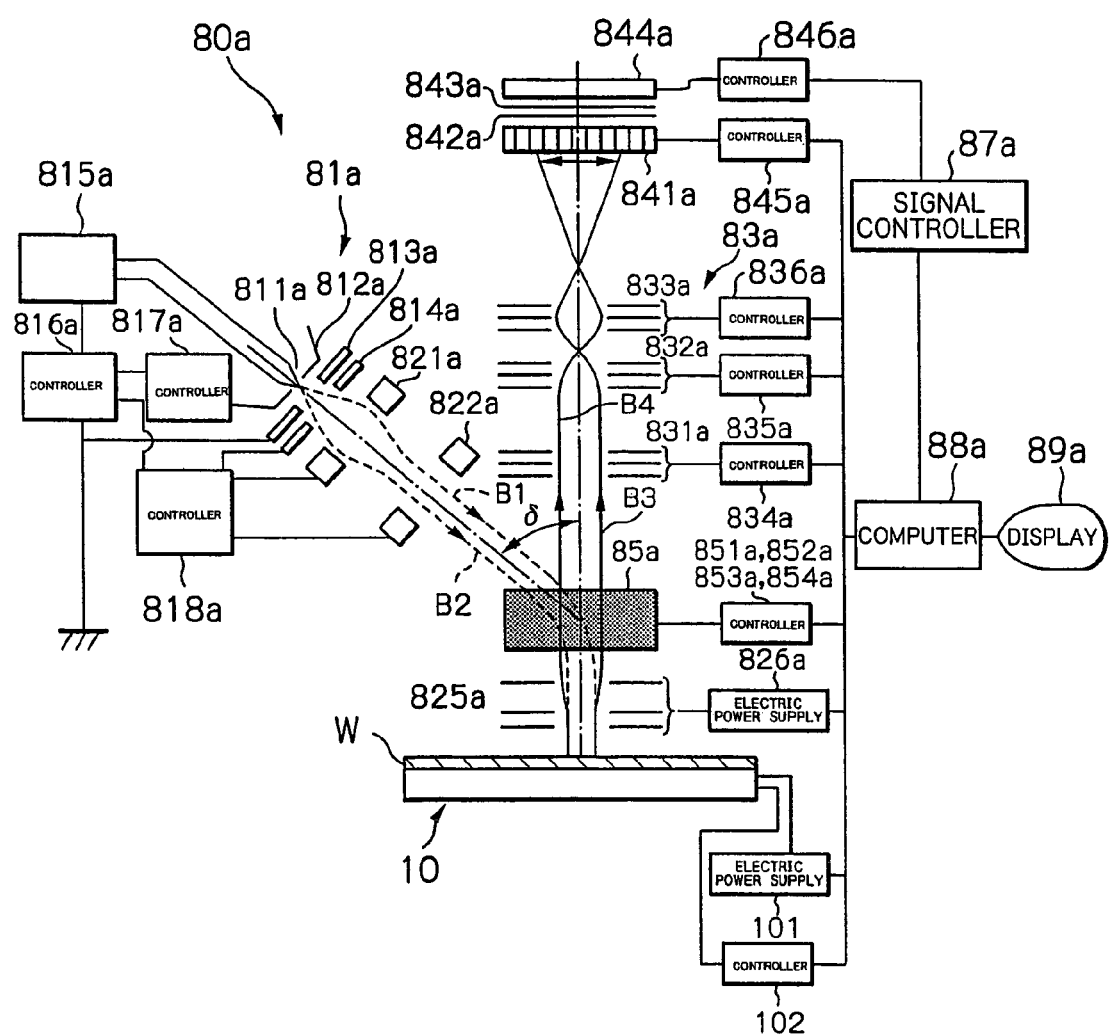
FIG. 26 is a general schematic view of an example of an electron beam inspection system equipped with the stage device according to the present invention.

FIG. 26 shows an example of an electron beam inspection system (herein-after referred to as an inspection system) 80a to which the stage device according to the present invention is applicable. The inspection system 80a comprises, in general, an electron beam irradiating section and a controller thereof; a stage device on which a sample is mounted and a controller thereof; an optical image projecting section using secondary/reflected electron beams and a controller thereof; an electron beam detecting section and a controller thereof; and an electron beam deflecting section and a controller thereof.

The electron beam irradiating section is arranged over the stage device 10 obliquely at a predetermined angle (for example, 30 degree to 40 degree) with respect to a direction perpendicular to the surface of the sample such as a semiconductor wafer or photo mask mounted on the stage device.

The electron beam irradiating section comprises an electron gun 81a, two-stage lenses 821a and 822a having four poles. More concretely, the electron gun 81a includes a lanthanum hexaboride (hereinafter refer to LaB6) cathode 811a having a rectangular electron emission surface of a size of 100 um×10 um, a Wehnelt electrode 812a having a rectangular opening, an anode 813a having a rectangular opening and a deflector 814a for adjusting an optical axis of an electron beam. Since the cathode 811a has a rectangular electron emission surface, the cross-sectional shape of the electron beam is rectangular. If an electron beam having an elongated shape in cross-section such as, for example, a linear shape or an elongated elliptical shape other than the rectangular shape is used, the current density of the electron beam, and therefore, a S/N ratio of a detected signal becomes high. An electron beam having a cross-sectional shape other than an elongated shape may also be used.

Operation of the LaB6 cathode 811a, the Wehnelt electrode 812a, the anode 813a and the deflector 814a is controlled by the controllers 815a, 816a and 818a to adjust an acceleration voltage, an emission current and the optical axis.

In addition, there are provided two-stage electrostatic lenses 821a and 822a having four poles and a controller 818a for controlling the operation of these lenses 821a and 822a. The electron beams B1 and B2 emitted from the cathode are converged by lenses 821a and 822a so that they form a rectangular beam irradiated area having a size of 100 um×25 um on the surface of the sample W. In this way, the converged electron beams enter into the electron beam deflecting section 85a. The electron beams irradiated from the electron beam irradiating section thus enter into the electron beam deflecting section obliquely by an inclination of δ degree with respect to the direction perpendicular to the surface of the sample W. An electron optical lens may be structured to have by only one lens or two or more multipolar lenses.

As the electron beams B1 and B2 enter into the electron beam deflecting section 85a, they are deflected such that the optical axis thereof becomes substantially perpendicular to the surface of the sample W and are emitted therefrom. The emitted electron beams are converged by a rotation-symmetrical, electrostatic lens 825a applied with a predetermined voltage by an electric power supply 826a and irradiated perpendicularly to the surface of the sample. As described hereinafter, the angle of the direction along which a secondary electron beam or reflected beam emerging from the surface of the sample W enters into the optical image projecting section using electron beams is perpendicular to the surface of the sample W. Therefore, the angle of incidence of the electron beams to the sample and the angle with which the secondary electron beams and reflected beams enter into the optical image projecting section using electron beams are perpendicular to the surface of the sample. However, it is not necessarily required that these two angles completely coincide with each other. They may be within the range between −5 degree and +5 degree.

A predetermined voltage is applied to the sample W by means of an electric power supply 110a. The movement of the stage device 10 within an X-Y plane is controlled by a controller 102. The value of a voltage to be applied to the sample W should be determined based on a resolving performance of the optical image projecting section using electron beams. For example, the secondary electron beam and/or reflected electron beam takes, preferably, a value of 5 kV, in order to obtain a resolution of 0.1 μm or less. However, on the other hand, energy of the electron beam is determined by a difference between the value of a voltage applied to the sample W and the value of a voltage of the electron beam striking on the sample. If the sample is a semiconductor wafer to be inspected, the value of voltage of the electron beam striking the sample is commonly at a level of 800V, in order to decrease damages of sample caused by irradiation of the electron beam and prevent the sample from charging. Therefore, the value of voltage of the electron beam is, preferably, to a level of 5.8 kV.

As the electron beams B3 and B4 are irradiated to the surface of the sample, secondary electron and/or reflected electron providing information regarding a shape and/or material and/or electric potential of the sample surface are emitted. These electrons are accelerated by an acceleration electric field generated between the sample and the electrostatic lens 825a by application of a voltage to the sample from the above-mentioned electric power supply, and enter into the electron beam deflection section 85a while passing through a track having a focal point at infinity by operation of the electrostatic lens.

The electron beam deflecting section 85a operates under control of controllers 851a, 852a and 853a so that the secondary electron beams and/or reflected electron beams B3 and B4 entering from the sample advance straight. As a result, electron beams pass through the electron beam deflecting section 85a to enter into the optical image projecting section using electron beams.

The optical image projecting section using electron beams is disposed such that the optical axis thereof is perpendicular to the surface of the sample W, and includes a three-stage rotation-symmetrical electrostatic lens. The electron beans B3 and B4 are extended by means of electrostatic lenses 831a, 832a and 833a. The voltage applied to these electrostatic lenses is controlled by respective controllers 834a, 835a and 836a.

The extended electron beams B3 and B4 are detected by an electron beam detecting section. The electron beam detecting section 84a includes MCP detector 841a, a fluorescent screen 842a, light guide 843a and CCD camera 844a. The electron beams B3 and B4 entered into the MCP detector 841a are amplified up to $10^4$ time to $10^6$ time and irradiate the fluorescent screen. As the electron beams are irradiated to the fluorescent screen 842a, a fluorescent image is generated and the CCD camera 844a detects the fluorescent image through the light guide 843a. The CCD camera 844a transmits the detected fluorescent image to an image data host computer 88a via a signal controller 87a as an image data under control by the controller 846a. The image data host computer 88a performs processes such as an image display, storage of the image data and an image procession.

Figure 27:
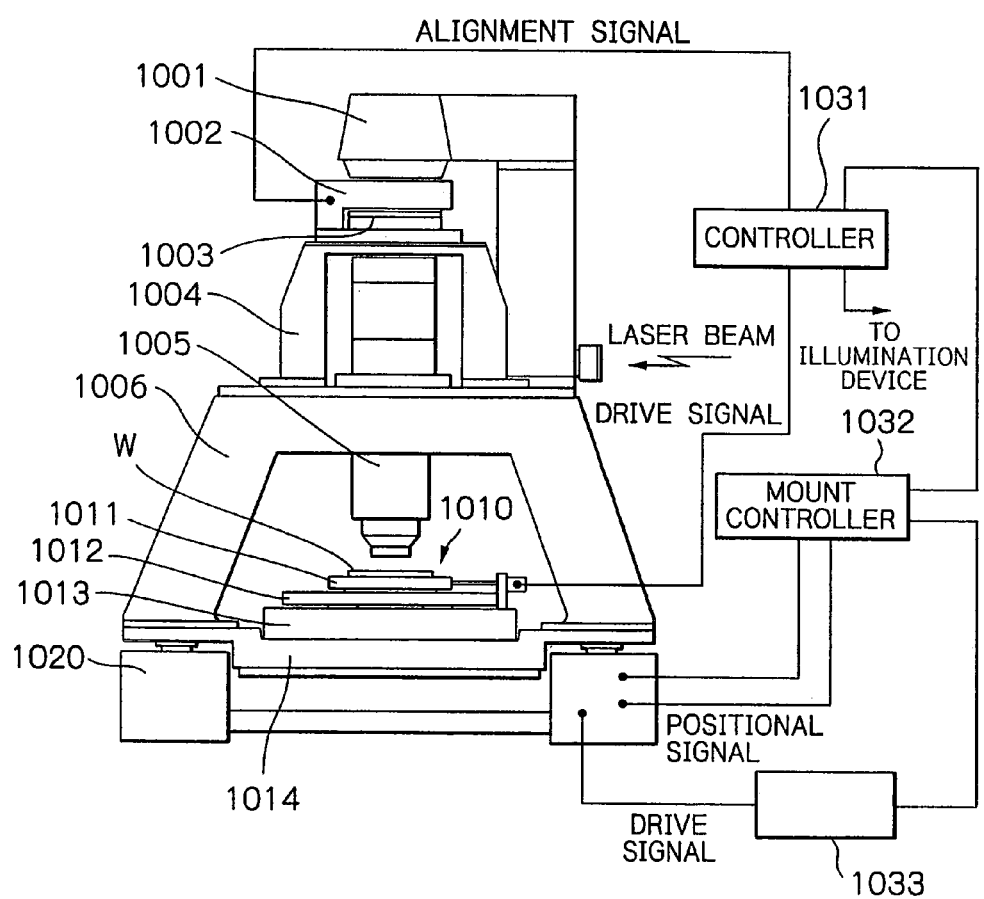
FIG. 27 shows an example of an electron beam inspection system.

FIG. 27 shows a basic structure of an exposure apparatus to which the stage device according to the present invention is adapted to be incorporated.

In FIG. 27, reference numeral 1001 denotes an illumination system which lead a laser beam entering thereto to an upper surface of a reticle, 1002 denotes an alignment scope for detecting a position of the reticle relative to a reticle reference mark and a position of a wafer, as a sample, relative to the reticle, 1003 denotes the reticle on which a pattern to be transferred to the sample or wafer is formed, 1004 denotes an outer barrel supporting the reticle 1003 and the alignment scope 1002, 1005 denotes a projection lens system for reducing and projecting an image of the pattern formed on the reticle 1003 to the sample or wafer, 1006 denotes a barrel surface plate supporting the projection lens system, the illumination system and the outer barrel, Further more, 1010 denotes a stage device which may be a stage device according to the present invention, 1011 denotes an X-stage of the stage device 1010, which supports the wafer W and is movable in X-direction, 1012 denotes a Y-stage which supports the X-stage and is movable in Y-direction, 1013 denotes a stage surface plate supporting the Y-stage, and 1020 denotes a base surface plate supporting the barrel surface plate 1006 and stage surface plate 1013. Also, in FIG. 27, 1021 denotes mounts supporting the base surface plate 1020. Four units of the mounts fixed to four respective corner of the base surface plate are connected by means of a flame. 1031 denotes a controller for controlling operation of the entire exposure apparatus, 1032 denotes a mount controller for mainly controlling operation of the four mounts 1012, and 1033 denotes derive system for driving respective actuators for the four mount 1012. In the above stage device 1010, the X-stage corresponds to the scanning axis stage and the Y-stage corresponds to the stepping axis stage.

Operation of the exposure apparatus shown in FIG. 27 will be explained hereinafter.

As a wafer W is transferred on the X-stage 1011 of the stage device 1010 by means of a wafer transfer system (not shown), a driving signal for commencing driving movement of the X-stage so that the wafer held on the X-stage is moved to the position at which exposing of the wafer is performed (exposure stating position) is output. Based on the output driving signal, the X-stage or the Y-stage commence its stepping movement. When the stepping movement finished, the final position of the wafer is measured and the signal obtained by this measurement is fed back to the X-stage and the Y-stage, thereby finishing positioning of the wafer.

On the other hand, vibration from a floor, vibration caused by movement of stage device, or change in posture of the entire exposure apparatus are detected by means of the mounts 1021 and the detected results are fed back to the mount controller 1032 as an acceleration signal and a displacement signal. By means of this operation, a quick vibration damping and a quick positioning operation are performed. As the damping and the positioning operation is finished, the mount controller 1032 output a finish signal to the controller 1031.

The controller 1031, after receiving a finish signal from the alignment scope 1002 and the mount controller 1032, output a command signal instructing commencement of irradiation by the light source which is a laser beam source. The laser beam emerged from the light source is irradiated to the wefer W through the illumination system 1001, reticle 1003 and projection lens system 1005 and thus, the wafer is exposed.

In the exposure apparatus, if the wavelength of the used light is short, the light is extremely diminished within the atmosphere. In order to avoid such a problem, it is preferable to decrease oxygen density in the ambience in which the exposure apparatus is disposed. In such a case, the area enclosed by the broken line shown in FIG. 27 is disposed within a chamber in which major parts of exposure apparatus are arranged and the chamber is maintained in a vacuum state or a helium gas charged state.

Figure 28:
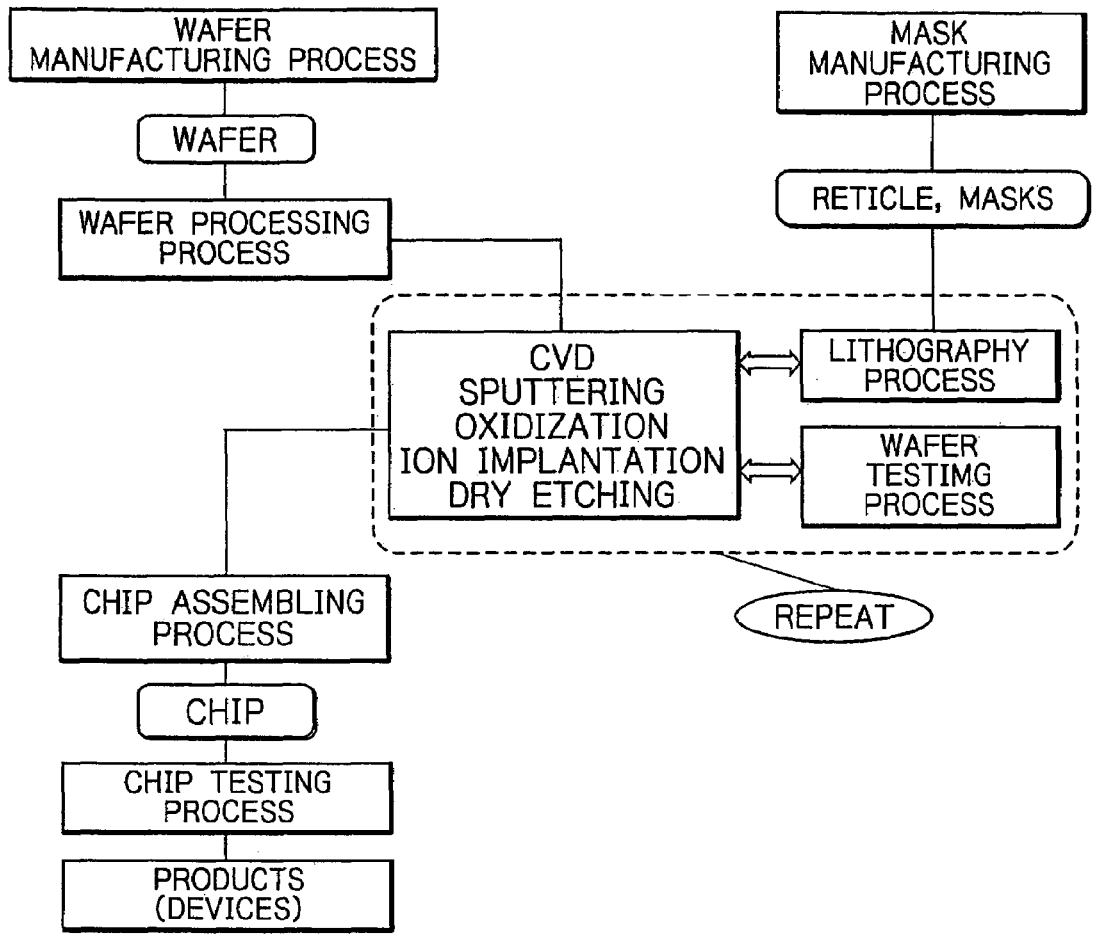
FIG. 28 is a flow chart showing one embodiment of a manufacturing method of a semiconductor device according to the present invention.
Figure 29:
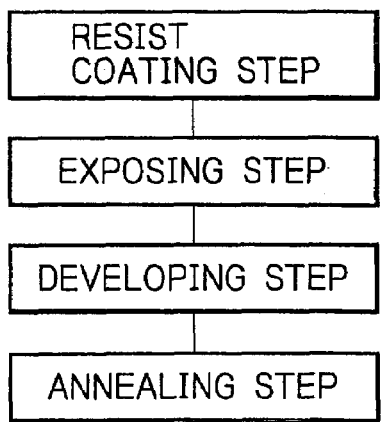
FIG. 29 is a flow chart showing a lithography step forming a core process in a wafer processing step.
Figure 30:
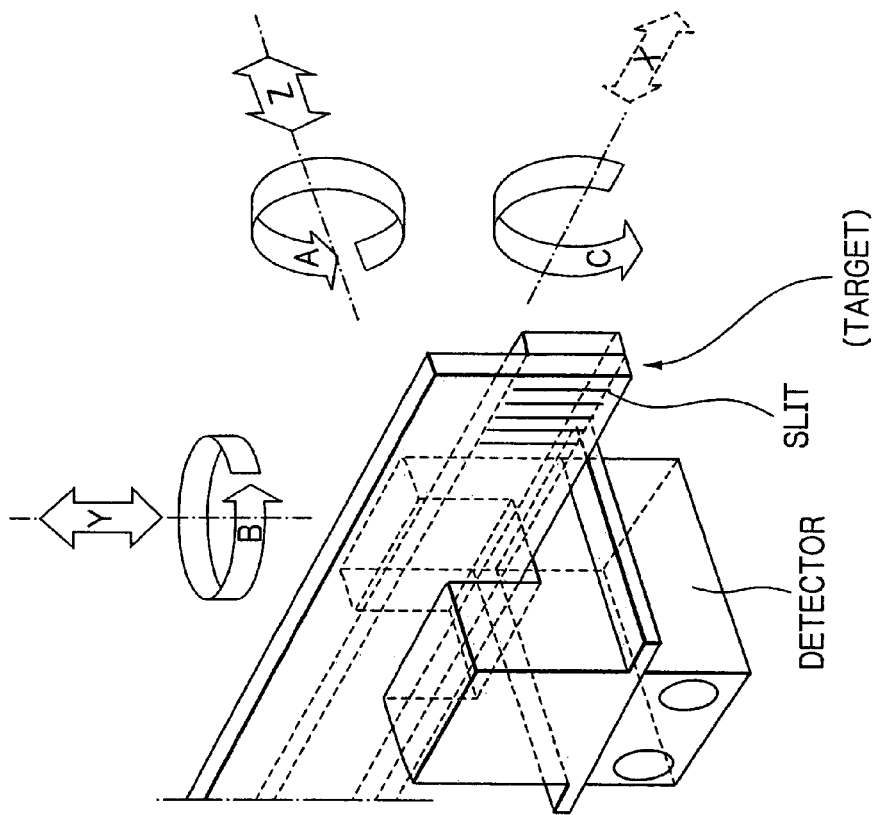
FIG. 30 is a schematic diagram showing a physical relationship between a detection section of a linear encoder and a target in a movable side as well as a definition of coordinate axes therefore.

Turning now to FIG. 28 and FIG. 29, an example of a semiconductor device manufacturing method will be described.

FIG. 28 is a flow chart showing one embodiment of a method for manufacturing a semiconductor device according to the present invention. The manufacturing process of this embodiment includes the following main processes.
(1) A wafer manufacturing process for manufacturing a wafer (or wafer preparing process for preparing a wafer).
(2) A mask manufacturing process for fabricating a mask to be used in the exposure (or a mask preparing process).
(3) A wafer processing process for performing any processing treatments necessary for the wafer.
(4) A chip assembling process for cutting out those chips formed on the wafer one by one to make them operative.
(5) A chip inspection process for inspecting an assembled chip.

It is to be appreciated that each of those processes further comprises several sub-processes.

Among these main processes, the one most importance is the process that gives a critical affection to the performance of the device is the wafer processing process designated in (3). In this wafer processing process, the designed circuit patterns are stacked on the wafer one on another, thus to form many chips, which will function as memories and MPUs. This wafer processing process includes the following sub-processes.
(A) A thin film deposition process for forming a dielectric thin film to be used as an insulation layer and/or a metallic thin film to be formed into a wiring section or an electrode section, or the like (by using the CVD process or the sputtering).
(B) An oxidizing process for oxidizing the formed thin film and/or the wafer substrate.
(C) A lithography process for forming a pattern of the resist by using a mask (reticle) in order to selectively process the thin film layer and/or the wafer substrate.
(D) An etching process for processing the thin film layer and/or the wafer substrate in accordance with the pattern of the resist (by using, for example, dry etching technology).
(E) An ions/impurities implant and diffusion process.
(F) A resist stripping process.
(G) An inspection process for inspecting the processed wafer.

It should be noted that the wafer processing process must be performed repeatedly as desired depending on the number of layers contained in the wafer, to thereby manufacture a semiconductor device that will be able to operate as designed.

FIG. 29 is a flow chart showing the lithography process included as a core process in the wafer processing process of FIG. 28. The lithography process comprises the respective processes as described below.
(a) A resist coating process for coating the wafer having a circuit pattern formed thereon in the preceding stage with the resist.
(b) An exposing process for exposing the resist.
(c) A developing process for developing the exposed resist to obtain the pattern of the resist.
(d) An annealing process for stabilizing the developed pattern.

Since the semiconductor device manufacturing process, the wafer processing process and the lithography process described above are well known, no further explanation of them will be given.

If the defect inspection apparatus and the defect inspection method or the exposing apparatus and the exposing method according to the present invention are applied to the above (G) inspection process or the above (c) exposing process, a fine pattern can be inspected or exposed with a high precision and in a stable manner, and accordingly a yield of products may be improved and shipment of any defective products may be prevented.

As compared to a semiconductor manufacturing apparatus according to the prior art, in which a conventional stage device is disposed in a substrate processing space, a stage device of the present invention, if applied to the semiconductor manufacturing apparatus, can bring about the following effects.
(A) Even movement along a scanning axis may be accomplished.
(B) Since 99% or more of a total stage running distance required for processing one piece of substrate can be made in a space external to that for processing a substrate, cleanliness of a substrate processing space can be improved, an operational life time of a translatory guide mechanism may be also extended, and thus a maintenance cycle may be significantly extended.

(C) If in the future a fine and highly precise pattern is required, as is the case in very Large Scale Integrated circuit, a restriction of the light on its wave length may inhibit a desired patterning from being obtained. To overcome this problem, there one method is used wherein an electron beam is employed instead of light. The present invention can provide a stage device essential to an exposing, drawing or inspection apparatus that employs an electron beam.

Further, aiming to solve more practical problems;

(D) A deformation of a stage reference plane resulting from a differential pressure fluctuation acting on a chamber may be prevented.

(E) An error in measurement of displacement resulting from a differential pressure fluctuation acting on the chamber may be improved.

(F) A pressure fluctuation caused by stroke movement of the scanning axis may be decreased.

(G) By using a hydraulic cylinder for driving the scanning axis, low heat, high response and high speed can all be stably achieved, thereby accomplishing a more sophisticated stage device as compared to that of the prior art.

(H) According to the angle detecting device, in which a rotational displacement of a rotating object can be converted into a linear displacement in a specified direction for a target and advantageously a highly developed linear encoder or a linear sensor is made usable in an efficient manner, such an advanced effect can be obtained that the angle detecting device having a high resolution in combination with a broad dynamic range can be achieved.

For example, in recent years, in a case of requiring a fine and highly precise pattern, as is the case of a very Large Scale Integration, the prior art method of irradiating light so as to expose a photo resist film thereto is no longer usable to obtain a desired patterning, due to a wavelength restriction of light. There is one method to overcome this problem that uses an electron beam instead of the light. In this case, a space into which the electron beam is irradiated is required to be held in a vacuum condition, essentially in a clean vacuum condition. In addition, it is required that any moving components used therein must be non-magnetic (low-magnetic, relative magnetic permeability=0.01 or lower) in order to prevent an orbit of the electron beam to be influenced thereby.

(I) According to the present invention, in which a target in a movable unit side has employed a non-magnetic material having a relative magnetic permeability is equal to 0.01 or less, the angle detecting device with a required resolution plus dynamic range can be provided even under those constrains of the vacuum and the non-magnetic characteristics.

(J) Further, according to the present invention, in which the conversion means can be implemented by a combination of the simple structure with the components having actual results, the detecting device having a high performance as well as a high reliability can be provided yet at reduced increase in cost.

(K) Further, according to the present invention, in which a conversion means has at least two roller bearings having different rotational axes from each other, and the at least two roller bearings are positioned so as to be in point-to-point contact with each other, the heating elements can be eliminated unlimitedly and thereby the device is made usable even in a processing space held in vacuum in a preferred manner.

Although the present invention has been described above in detail with reference to the drawings, the foregoing description is for explanatory purposes and not intended to limit characteristics. It should be understood that the foregoing description merely illustrates and explains preferred embodiments, and all modifications and changes within the scope of the spirit of the present invention are protected.

The entire disclosure of Japanese Patent Application Nos. 2002-12338 and 2002-51256 filed on January 22 and Feb. 27, 2002, respectively, including specification, claims, drawings and summary are incorporated herein by reference in its entirety.

What is claimed is:

1. A stage device for a semiconductor manufacturing apparatus, comprising:
    a Y-axis stage including a fixed component and a movable component movably supported along the Y-axis by said fixed component;
    an X-axis stage including a fixed component and a movable component movably supported along the X-axis by said latter fixed component;
    said fixed component of said X-axis stage being disposed on said movable component of said Y-axis stage;
    said Y-axis being designed as a scanning axis, while said X-axis is designed as a stepping axis; and
    a non-contact sealing device being arranged between said fixed component and said movable component of said Y-axis stage, said non-contact sealing device being constituted by vacuuming a space between said fixed component and said movable component.

2. A stage device according to claim 1, in which a hydrostatic bearing is arranged in said fixed component of said Y-axis stage for movably guiding said movable component of said Y-axis stage, and said non-contact sealing device is arranged on the same plane as of a bearing surface of said hydrostatic bearing, wherein a geometry of a cross section of a guiding portion of said movable component equipped with said non-contact sealing device is defined to be rectangular in shape, and said fixed component of said Y-axis stage is installed on a rigid base.

3. A stage device according to claim 1, in which a housing defining a vacuum chamber for accommodating at least said X-axis stage has a flat rectangular plane in geometry and said housing is supported in its four corners by said base.

4. A stage device according to claim 3, further comprising a laser interference type displacement meter for detecting a position of said movable component of said X-axis stage, wherein a fixed reference plane for an interferometer of said laser interference type displacement meter is defined by said corner portions of said housing.

5. A stage device according to claim 4, further comprising a moisture barrier plate for preventing a water content from adhering on a surface of said movable component of said Y-axis stage.

6. A stage device according to claim 4, further comprising an angle detecting device for detecting a rotation angle of a rotating object, including: a target; a conversion means for converting a rotational displacement of said rotating object to a linear displacement in a specified direction for said target; and a detecting means for detecting the linear displacement of said target.

7. A stage device according to claim 3, further comprising a laser interference type displacement meter for detecting a position of said movable component of said X-axis stage, wherein a fixed reference plane for an interferometer of said laser interference type displacement meter is defined by a top surface of said base external to the chamber, and a pedestal for fixing said interferometer penetrates a bottom wall of said housing with a sealing device arranged between this penetrated bottom wall and said pedestal.

8. A stage device according to claim 7, further comprising a moisture barrier plate for preventing a water content from adhering on a surface of said movable component of said Y-axis stage.

9. A stage device according to claim 7, further comprising an angle detecting device for detecting a rotation angle of a rotating object, including: a target; a conversion means for converting a rotational displacement of said rotating object to a linear displacement in a specified direction for said target; and a detecting means for detecting the linear displacement of said target.

10. A stage device according to claim 1, further comprising a moisture barrier plate for preventing a water content from adhering on a surface of said movable component of said Y-axis stage.

11. A stage device according to claim 1, further comprising a dry gas feeding shower nozzle for preventing a water content from adhering on the surface of said movable component of said Y-axis stage.

12. A stage device according to claim 1, further comprising an angle detecting device for detecting a rotation angle of a rotating object, including: a target; a conversion means for converting a rotational displacement of said rotating object to a linear displacement in a specified direction for said target; and a detecting means for detecting the linear displacement of said target.

13. A stage device according to claim 1, further comprising an irradiation unit for irradiating at least an electron beam or a charged particle beam, said irradiation unit disposed in a location opposite to said base with respect to said stage device.

14. An angle detecting device for detecting a rotation angle of a rotating object, including:
   a target supported by a support means in a manner that said target has a degree of freedom of linear movement in a specific direction;
   a conversion means for converting a rotational displacement of said rotating object to a linear displacement of said target in a specified direction; and
   a detecting means for detecting the linear displacement of said target;
   wherein said conversion means includes a rod member extending radially from said rotating object and a member translating rotational movement of said rod member to said target.

15. An angle detecting device according to claim 14, in which said target is a non-magnetic material having a relative magnetic permeability equal to or less than 1.01.

16. An angle detecting device according to claim 14, wherein said conversion means has at least one degree of freedom of internal linear movement in a direction different from said specified direction and at least one degree of freedom of internal rotation.

17. An angle detecting device according to claim 16, in which said conversion means has at least two roller bearings having different rotational axes, respectively, said at least two roller bearings disposed in contact with each other.

18. An angle detecting device according to claim 17, in which said conversion means comprises an elastic element for maintaining the contact condition between said at least two roller bearings in a flexible manner.

19. An angle detecting device according to claim 14, in which said support means is a leaf spring element attached to said target, and said leaf spring element exerts a substantial elastic force on said target in a direction different from said specified direction.

20. An angle detecting device according to claim 14, in which said support means is a linear guide means for constraining a movement of said target to be a linear movement in said specified direction.

* * * * *